(12) United States Patent
Mishra et al.

(10) Patent No.: US 8,436,127 B2
(45) Date of Patent: May 7, 2013

(54) SEMICONDUCTOR MATERIALS BASED ON DIKETOPIPERIDINOPIPERIDINE COPOLYMERS

(75) Inventors: Ashok Kumar Mishra, Singapore (SG); Subramanian Vaidyanathan, Basel (CH); Hiroyoshi Noguchi, Singapore (SG); Florian Dötz, Singapore (SG); Yucui Guan, Hangzhou (CN)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 13/454,403

(22) Filed: Apr. 24, 2012

(65) Prior Publication Data

US 2012/0277404 A1    Nov. 1, 2012

Related U.S. Application Data

(60) Provisional application No. 61/479,872, filed on Apr. 28, 2011.

(51) Int. Cl.
*C08G 59/40*    (2006.01)

(52) U.S. Cl.
USPC .................. 528/118; 528/9; 528/94; 528/380

(58) Field of Classification Search .................. 528/380, 528/9, 127

See application file for complete search history.

(56) References Cited

PUBLICATIONS

Winnewisser et al. Adv. Mater. 2008, 20, 2217-2224.*

* cited by examiner

*Primary Examiner* — Shane Fang
(74) *Attorney, Agent, or Firm* — Oblon, Spivak, McClelland, Maier & Neustadt, L.L.P.

(57) ABSTRACT

The present invention provides a polymer comprising a unit of formula

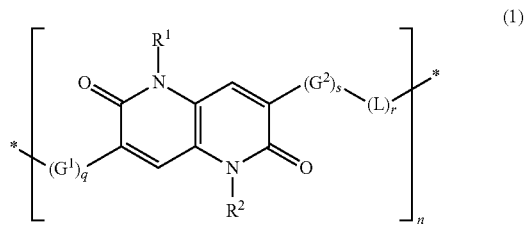

and an electronic device comprising the polymer as semiconducting material.

19 Claims, No Drawings

SEMICONDUCTOR MATERIALS BASED ON DIKETOPIPERIDINOPIPERIDINE COPOLYMERS

Organic semiconducting materials can be used in electronic devices such as organic photo-voltaic devices (OPVs), organic field-effect transistors (OFETs), organic light emitting diodes (OLEDs), and organic electrochromic devices (ECDs).

For efficient and long lasting performance, it is desirable that the organic semiconducting material-based devices show high charge carrier mobility as well as high stability, in particular towards oxidation by air, under ambient environmental conditions.

Furthermore, it is desirable that the organic semiconducting materials are compatible with liquid processing techniques such as spin coating as liquid processing techniques are convenient from the point of processability, and thus allow the production of low cost organic semiconducting material-based electronic devices. In addition, liquid processing techniques are also compatible with plastic substrates, and thus allow the production of light weight and mechanically flexible organic semiconducting material-based electronic devices.

The use of organic semiconducting materials is known in the art.

Bao, Z.; Dobadalapur, A.; Lovinger, A. J. *Appl. Phys. Lett.* 1996, 69, 4108-4110 describes the use of regioregular poly (3-hexylthiophene) in field-effect transistors.

Ong, B. S.; Wu, Y.; Liu, P.; Gardner, S. *J. Am. Chem. Soc.* 2004, 126, 3378-3379 describes polymers of formula

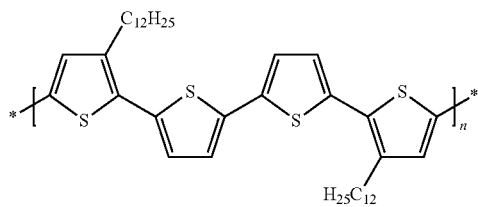

for use in organic field effect transistors (OFETs).

Zhang, M.; Tsao, H. N.; Pisula, W.; Yang, C.; Mishra, A. K.; Mullen, K. *J. Am. Chem. Soc.* 2007, 129, 3472-3473 describes polymers of formula

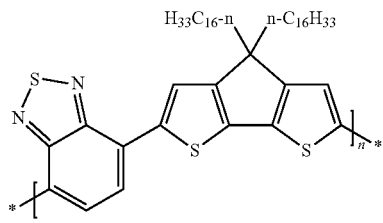

for use in organic field effect transistors (OFETs).

Zou, Y.; Najari, A.; Berrouard, P.; Beaupre, S.; Badrou, R. A.; Tao, Y.; Leclerc, M. *J. Am. Chem. Soc.* 2010, 132, 5330-5331 describes polymers of formula

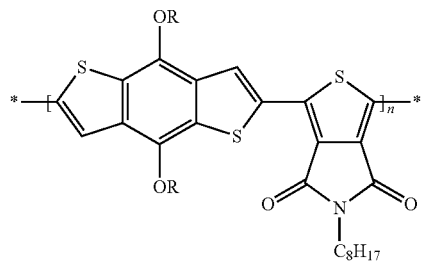

as donor materials for use in photovoltaic devices.

L. Bürgi, M. Turbiez, R. Pfeiffer, F. Bienewald, H.-J. Kirner, C. Winnewisser, *Adv. Mater.* 2008, 20, 2217-2224 describes polymers of formula

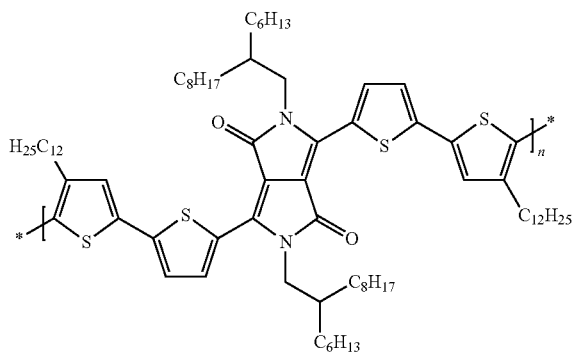

for use in organic field effect transistors (OFETs).

J. C. Bijleveld, A. P. Zoombelt, S. G. J. Mathijssen, M. M. Wienk, M. Turbiez, D. M. de Leeuw, R. A. J. Janssen, *J. Am. Chem. Soc.* 2009, 131, 16616-16617 describes polymers of formula

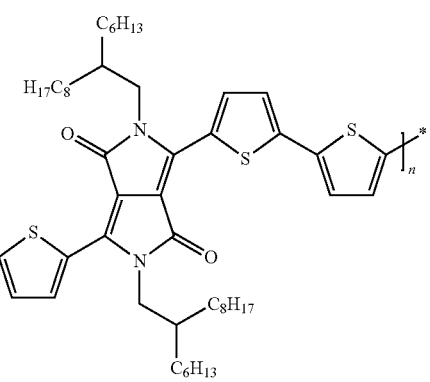

for use in organic field effect transistors (OFETs) and organic photovoltaic devices (OPVs).

N. Saito, T. Yamamoto *Macromolecules* 1995, 28, 4260-4267 describes polymers of formula

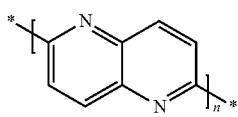

as an electrical conductor.

Diketopiperidinopiperidine derivatives are also known in the art.

E. Bisagni, C. Landras, S. Thirot, C. Huel. *Tetrahedron*, 1996, 52 (31), 10427-10440 describes the synthesis of compound of formula

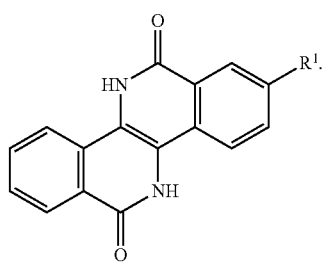

H. I hkawa, N. Adachi *Heterocycles* 2000, 53 (1), 135-142 describes the synthesis of compound of formula

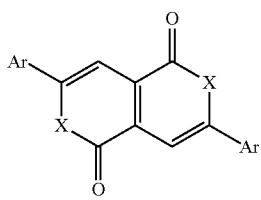

X=NMe, O
Ar=$C_6H_5$, 2-$MeC_6H_4$, 2,4,6-$Me_3C_6H_2$.

It was the object of the present invention to provide new organic semiconducting materials.

This object is solved by the polymer of claim 1 and the electronic device of claim 17.

The semiconducting material of the present invention is a polymer comprising a unit of formula

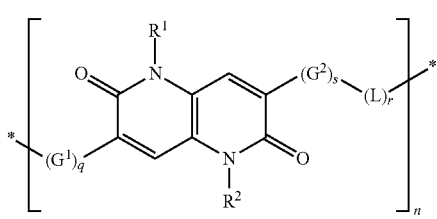

wherein
$R^1$ and $R^2$ are independently from each other H, $C_{1-30}$-alkyl optionally substituted with 1 to 6 substituents $R^c$, $C_{2-30}$-alkenyl optionally substituted with 1 to 6 substituents $R^c$, $C_{2-30}$-alkynyl optionally substituted with 1 to 6 substituents $R^c$, $C_{3-10}$-cycloalkyl optionally substituted with 1 to 6 substituents $R^d$, $C_{5-10}$-cycloalkenyl optionally substituted with 1 to 6 substituents $R^d$, monovalent 3 to 14 membered aliphatic heterocyclic residue optionally substituted with 1 to 6 substituents $R^d$, $C_{6-14}$-aryl optionally substituted with 1 to 6 substituents $R^e$ or monovalent 5 to 14 membered aromatic heterocyclic residue optionally substituted with 1 to 6 substituents $R^e$,
wherein
$R^c$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{3-10}$-cycloalkyl, monovalent 3 to 14 membered aliphatic heterocyclic residue, $C_{6-14}$-aryl and monovalent 5 to 14 membered aromatic heterocyclic residue;
$R^d$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{1-10}$-alkyl, $C_{2-10}$-alkenyl, $C_{2-10}$-alkynyl, $C_{6-14}$-aryl and monovalent 5 to 14 membered aromatic heterocyclic residue;
$R^e$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{1-10}$-alkyl, $C_{2-10}$-alkenyl, $C_{2-10}$-alkynyl, $C_{3-10}$-cycloalkyl, $C_{5-10}$-cycloalkenyl and monovalent 3 to 14 membered aliphatic heterocyclic residue,
wherein $R^3$ and $R^4$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue,
$G^1$ and $G^2$ are independently from each other $C_{6-14}$-arylene optionally substituted with 1 to 6 substituents $R^a$ or bivalent 5 to 14 membered aromatic heterocyclic residue optionally substituted with 1 to 6 substituents $R^a$,
wherein
$R^a$ at each occurrence are independently from each other selected from the group consisting of =O, =C(CN)$_2$, —O—$C_{2-6}$-alkylene-O—, halogen, —CN, —NO$_2$, —OH, $C_{1-30}$-alkoxy, —O—CH$_2$CH$_2$O—$C_{1-30}$-alkyl, —O—COR$^8$, —S—$C_{1-30}$-alkyl, —NH$_2$, —NHR$^8$, —NR$^8$R$^9$, —NH—COR$^8$, —COOH, —COOR$^8$, —CONH$_2$, —CONHR$^8$, —CONR$^8$R$^9$, —CO—H, —COR$^8$, $C_{1-30}$-alkyl optionally substituted with 1 to 6 substituents $R^f$, $C_{2-30}$-alkenyl optionally substituted with 1 to 6 substituents $R^f$, $C_{2-30}$-alkynyl optionally substituted with 1 to 6 substituents $R^f$, $C_{3-10}$-cycloalkyl optionally substituted with 1 to 6 substituents $R^9$, $C_{5-10}$-cycloalkenyl optionally substituted with 1 to 6 substituents $R^9$ and monovalent 3 to 14 membered aliphatic heterocyclic residue optionally substituted with 1 to 6 substituents $R^g$,
wherein
$R^8$ and $R^9$ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, $R^f$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^{10}$, —S—$C_{1-10}$-alkyl, —NH$_2$, —NHR$^{10}$, —NR$^{10}$R$^{11}$, —NH—COR$^{10}$, —COOH, —COOR$^{10}$, —CONH$_2$, —CONHR$^{10}$, —CONR$^{10}$R$^{11}$, —CO—H, —COR$^{10}$, $C_{3-10}$-cycloalkyl, monovalent 3 to 14 membered aliphatic heterocyclic residue, $C_{6-14}$-aryl and monovalent 5 to 14 membered aromatic heterocyclic residue;

$R^g$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^{10}$, —S—$C_{1-10}$-alkyl, —NH$_2$, —NHR$^{10}$, —NR$^{10}$R$^{11}$, —NH—COR$^{10}$, —COOH, —COOR$^{10}$, —CONH$_2$, —CONHR$^{10}$, —CONR$^{10}$R$^{11}$, —CO—H, —COR$^{10}$, $C_{1-10}$-alkyl, $C_{2-10}$-alkenyl, $C_{2-10}$-alkynyl, $C_{6-14}$-aryl and monovalent 5 to 14 membered aromatic heterocyclic residue;

wherein $R^{10}$ and $R^{11}$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, or $G^1$ and $G^2$ are independently from each other

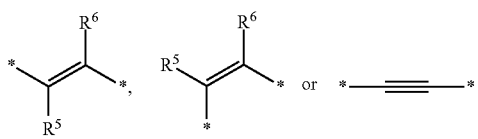

wherein $R^5$ and $R^6$ are independently from each other H or $C_{1-30}$-alkyl, L is $C_{6-24}$-arylene optionally substituted with 1 to 6 substituents $R^b$ or bivalent 5 to 24 membered aromatic heterocyclic residue optionally substituted with 1 to 6 substituents $R^b$, wherein $R^b$ at each occurrence are independently from each other selected from the group consisting of =O, =C(CN)$_2$, —O—$C_{2-6}$-alkylene-O—, halogen, —CN, —NO$_2$, —OH, $C_{1-30}$-alkoxy, —O—CH$_2$CH$_2$O—$C_{1-30}$-alkyl, —O—COR$^{12}$, —S—$C_{1-30}$-alkyl, —NH$_2$, —NHR$^{12}$, —NR$^{12}$R$^{13}$, —NH—COR$^{12}$, —COOH, —COOR$^{12}$, —CONH$_2$, —CONHR$^{12}$, —CONR$^{12}$R$^{13}$, —CO—H, —COR$^{12}$, $C_{1-30}$-alkyl optionally substituted with 1 to 6 substituents $R^h$, $C_{2-30}$-alkenyl optionally substituted with 1 to 6 substituents $R^h$, $C_{2-30}$-alkynyl optionally substituted with 1 to 6 substituents $R^h$, $C_{3-10}$-cycloalkyl optionally substituted with 1 to 6 substituents $R^i$, $C_{5-10}$-cycloalkenyl optionally substituted with 1 to 6 substituents $R^i$ and monovalent 3 to 14 membered aliphatic heterocyclic residue optionally substituted with 1 to 6 substituents $R^i$, wherein $R^{12}$ and $R^{13}$ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, $R^h$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^{14}$, —S—$C_{1-10}$-alkyl, —NH$_2$, —NHR$^{14}$, —NR$^{14}$R$^{15}$, —NH—COR$^{14}$, —COOH, —COOR$^{14}$, —CONH$_2$, —CONHR$^{14}$, —CONR$^{14}$R$^{15}$, —CO—H, —COR$^{14}$, $C_{3-10}$-cycloalkyl, monovalent 3 to 14 membered aliphatic heterocyclic residue, $C_{6-14}$-aryl and monovalent 5 to 14 membered aromatic heterocyclic residue;

$R^i$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^{14}$, —S—$C_{1-10}$-alkyl, —NH$_2$, —NHR$^{14}$, —NR$^{14}$R$^{15}$, —NH—COR$^{14}$, —COOH, —COOR$^{14}$, —CONH$_2$, —CONHR$^{14}$, —CONR$^{14}$R$^{15}$, —CO—H, —COR$^{14}$, $C_{1-10}$-alkyl, $C_{2-10}$-alkenyl, $C_{2-10}$-alkynyl, $C_{6-14}$-aryl and monovalent 5 to 14 membered aromatic heterocyclic residue;

wherein $R^{14}$ and $R^{15}$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, or L is

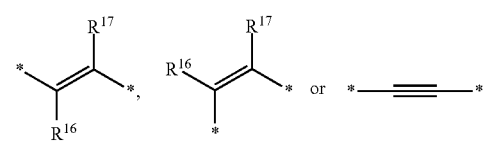

wherein $R^{16}$ and $R^{17}$ are independently from each other H, —CN or halogen, q and s are independently from each other 0, 1, 2, 3, 4 or 5, r is 0, 1 or 2, and n is an integer from 2 to 10,000.

Preferably, the semiconducting material of the present invention is a polymer consisting essentially of a unit of formula

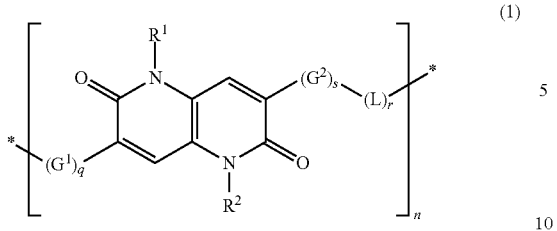

wherein
R¹ and R² are independently from each other H, $C_{1-30}$-alkyl optionally substituted with 1 to 6 substituents $R^c$, $C_{2-30}$-alkenyl optionally substituted with 1 to 6 substituents $R^c$, $C_{2-30}$-alkynyl optionally substituted with 1 to 6 substituents $R^c$, $C_{3-10}$-cycloalkyl optionally substituted with 1 to 6 substituents $R^d$, $C_{5-10}$-cycloalkenyl optionally substituted with 1 to 6 substituents $R^d$, monovalent 3 to 14 membered aliphatic heterocyclic residue optionally substituted with 1 to 6 substituents $R^d$, $C_{6-14}$-aryl optionally substituted with 1 to 6 substituents $R^e$ or monovalent 5 to 14 membered aromatic heterocyclic residue optionally substituted with 1 to 6 substituents $R^e$, wherein
$R^c$ at each occurrence are independently from each other selected from the group consisting of =O, =C(CN)₂, —O—$C_{2-6}$-alkylene-O—, halogen, —CN, —NO₂, —OH, $C_{1-10}$-alkoxy, —O—CH₂CH₂O—$C_{1-10}$-alkyl, —O—COR³, —S—$C_{1-10}$-alkyl, —NH₂, —NHR³, —NR³R⁴, —NH—COR³, —COOH, —COOR³, —CONH₂, —CONHR³, —CONR³R⁴, —CO—H, —COR³, $C_{3-10}$-cycloalkyl, monovalent 3 to 14 membered aliphatic heterocyclic residue, $C_{6-14}$-aryl and monovalent 5 to 14 membered aromatic heterocyclic residue;

$R^d$ at each occurrence are independently from each other selected from the group consisting of =O, =C(CN)₂, —O—$C_{2-6}$-alkylene-O—, halogen, —CN, —NO₂, —OH, $C_{1-10}$-alkoxy, —O—CH₂CH₂O—$C_{1-10}$-alkyl, —O—COR³, —S—$C_{1-10}$-alkyl, —NH₂, —NHR³, —NR³R⁴, —NH—COR³, —COOH, —COOR³, —CONH₂, —CONHR³, —CONR³R⁴, —CO—H, —COR³, $C_{1-10}$-alkyl, $C_{2-10}$-alkenyl, $C_{2-10}$-alkynyl, $C_{6-14}$-aryl and monovalent 5 to 14 membered aromatic heterocyclic residue;

$R^e$ at each occurrence are independently from each other selected from the group consisting of =O, =C(CN)₂, —O—$C_{2-6}$-alkylene-O—, halogen, —CN, —NO₂, —OH, $C_{1-10}$-alkoxy, —O—CH₂CH₂O—$C_{1-10}$-alkyl, —O—COR³, —S—$C_{1-10}$-alkyl, —NH₂, —NHR³, —NR³R⁴, —NH—COR³, —COOH, —COOR³, —CONH₂, —CONHR³, —CONR³R⁴, —CO—H, —COR³, $C_{1-10}$-alkyl, $C_{2-10}$-alkenyl, $C_{2-10}$-alkynyl, $C_{3-10}$-cycloalkyl, $C_{5-10}$-cycloalkenyl and monovalent 3 to 14 membered aliphatic heterocyclic residue, wherein R³ and R⁴ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, G¹ and G² are independently from each other $C_{6-14}$-arylene optionally substituted with 1 to 6 substituents $R^a$ or bivalent 5 to 14 membered aromatic heterocyclic residue optionally substituted with 1 to 6 substituents $R^a$, wherein
$R^a$ at each occurrence are independently from each other selected from the group consisting of =O, =C(CN)₂, —O—$C_{2-6}$-alkylene-O—, halogen, —CN, —NO₂, —OH, $C_{1-30}$-alkoxy, —O—CH₂CH₂O—$C_{1-30}$-alkyl, —O—COR⁸, —S—$C_{1-30}$-alkyl, —NH₂, —NHR⁸, —NR⁸R⁹, —NH—COR⁸, —COOH, —COOR⁸, —CONH₂, —CONHR⁸, —CONR⁸R⁹, —CO—H, —COR⁸, $C_{1-30}$-alkyl optionally substituted with 1 to 6 substituents $R^f$, $C_{2-30}$-alkenyl optionally substituted with 1 to 6 substituents $R^f$, $C_{2-30}$-alkynyl optionally substituted with 1 to 6 substituents $R^f$, $C_{3-10}$-cycloalkyl optionally substituted with 1 to 6 substituents $R^g$, $C_{5-10}$-cycloalkenyl optionally substituted with 1 to 6 substituents $R^g$ and monovalent 3 to 14 membered aliphatic heterocyclic residue optionally substituted with 1 to 6 substituents $R^g$, wherein
R⁸ and R⁹ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, $R^f$ at each occurrence are independently from each other selected from the group consisting of =O, =C(CN)₂, —O—$C_{2-6}$-alkylene-O—, halogen, —CN, —NO₂, —OH, $C_{1-10}$-alkoxy, —O—CH₂CH₂O—$C_{1-10}$-alkyl, —O—COR¹⁰, —S—$C_{1-10}$-alkyl, —NH₂, —NHR¹⁰, —NR¹⁹R¹¹, —NH—COR¹⁰, —COOH, —COOR¹⁰, —CONH₂, —CONHR¹⁰, —CONR¹⁰R¹¹, —CO—H, —COR¹⁰, $C_{3-10}$-cycloalkyl, monovalent 3 to 14 membered aliphatic heterocyclic residue, $C_{6-14}$-aryl and monovalent 5 to 14 membered aromatic heterocyclic residue;

$R^g$ at each occurrence are independently from each other selected from the group consisting of =O, =C(CN)₂, —O—$C_{2-6}$-alkylene-O—, halogen, —CN, —NO₂, —OH, $C_{1-10}$-alkoxy, —O—CH₂CH₂O—$C_{1-10}$-alkyl, —O—COR¹⁰, —S—$C_{1-10}$-alkyl, —NH₂, —NHR¹⁰, —NR¹⁰R¹¹, —NH—COR¹⁰, —COOH, —COOR¹⁰, —CONH₂, —CONHR¹⁰, —CO—H, —COR¹⁰, $C_{1-10}$-alkyl, $C_{2-10}$-alkenyl, $C_{2-10}$-alkynyl, $C_{6-14}$-aryl and monovalent 5 to 14 membered aromatic heterocyclic residue;

wherein R¹⁰ and R¹¹ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, or
G¹ and G² are independently from each other

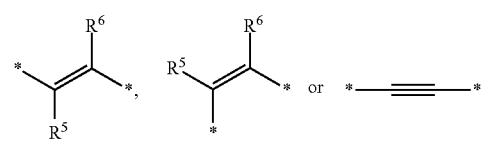

wherein
R⁵ and R⁶ are independently from each other H or $C_{1-30}$-alkyl,

L is $C_{6-24}$-arylene optionally substituted with 1 to 6 substituents $R^b$ or bivalent 5 to 24 membered aromatic heterocyclic residue optionally substituted with 1 to 6 substituents $R^b$,
wherein
$R^b$ at each occurrence are independently from each other selected from the group consisting of =O, =C(CN)$_2$, —O—$C_{2-6}$-alkylene-O—, halogen, —CN, —NO$_2$, —OH, $C_{1-30}$-alkoxy, —O—CH$_2$CH$_2$O—$C_{1-30}$-alkyl, —O—COR$^{12}$, —S—$C_{1-30}$-alkyl, —NH$_2$, —NHR$^{12}$, —NR$^{12}$R$^{13}$, —NH—COR$^{12}$, —COOH, —COOR$^{12}$, —CONH$_2$, —CONHR$^{12}$, —CONR$^{12}$R$^{13}$, —CO—H, —COR$^{12}$, $C_{1-30}$-alkyl optionally substituted with 1 to 6 substituents $R^h$, $C_{2-30}$-alkenyl optionally substituted with 1 to 6 substituents $R^h$, $C_{2-30}$-alkynyl optionally substituted with 1 to 6 substituents $R^h$, $C_{3-10}$-cycloalkyl optionally substituted with 1 to 6 substituents $R^i$, $C_{5-10}$-cycloalkenyl optionally substituted with 1 to 6 substituents $R^i$ and monovalent 3 to 14 membered aliphatic heterocyclic residue optionally substituted with 1 to 6 substituents $R^i$,
wherein
$R^{12}$ and $R^{13}$ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue,
$R^h$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^{14}$, —S—$C_{1-10}$-alkyl, —NH$_2$, —NHR$^{14}$, —NR$^{14}$R$^{16}$, —NH—COR$^{14}$, —COOH, —COOR$^{14}$, —CONH$_2$, —CONHR$^{14}$, —CONR$^{14}$R$^{15}$, —CO—H, —COR$^{14}$, $C_{3-10}$-cycloalkyl, monovalent 3 to 14 membered aliphatic heterocyclic residue, $C_{6-14}$-aryl and monovalent 5 to 14 membered aromatic heterocyclic residue;
$R^i$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^{14}$, —S—$C_{1-10}$-alkyl, —NH$_2$, —NHR$^{14}$, —NR$^{14}$R$^{15}$, —NH—COR$^{14}$, —COOH, —COOR$^{14}$, —CONH$_2$, —CONHR$^{14}$, —CONR$^{14}$R$^{15}$, —CO—H, —COR$^{14}$, $C_{1-10}$-alkyl, $C_{2-10}$-alkenyl, $C_{2-10}$-alkynyl, $C_{6-14}$-aryl and monovalent 5 to 14 membered aromatic heterocyclic residue;
wherein $R^{14}$ and $R^{15}$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue,
or
L is

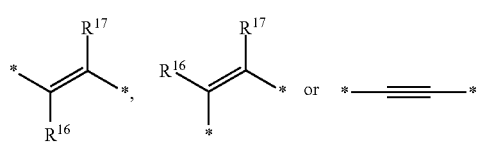

wherein
$R^{16}$ and $R^{17}$ are independently from each other H, $C_{1-30}$-alkyl, —CN or halogen,
q and s are independently from each other 0, 1, 2, 3, 4 or 5,
r is 0, 1 or 2,
and
n is an integer from 2 to 10,000.

The term "consisting essentially of" means that at least 80% by weight. Preferably at least 90% by weight, of the polymer consists of a unit of formula (1) based on the weight of the polymer.

More preferably, the semiconducting material of the present invention is a polymer of formula

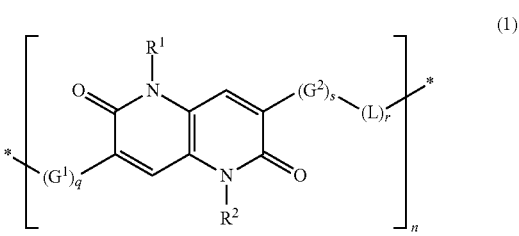

(1)

wherein
$R^1$ and $R^2$ are independently from each other H, $C_{1-30}$-alkyl optionally substituted with 1 to 6 substituents $R^c$, $C_{2-30}$-alkenyl optionally substituted with 1 to 6 substituents $R^c$, $C_{2-30}$-alkynyl optionally substituted with 1 to 6 substituents $R^c$, $C_{3-10}$-cycloalkyl optionally substituted with 1 to 6 substituents $R^d$, $C_{5-10}$-cycloalkenyl optionally substituted with 1 to 6 substituents $R^d$, monovalent 3 to 14 membered aliphatic heterocyclic residue optionally substituted with 1 to 6 substituents $R^d$, $C_{6-14}$-aryl optionally substituted with 1 to 6 substituents $R^e$ or monovalent 5 to 14 membered aromatic heterocyclic residue optionally substituted with 1 to 6 substituents $R^e$,
wherein
$R^c$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{3-10}$-cycloalkyl, monovalent 3 to 14 membered aliphatic heterocyclic residue, $C_{6-14}$-aryl and monovalent 5 to 14 membered aromatic heterocyclic residue;
$R^d$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{1-10}$-alkyl, $C_{2-10}$-alkenyl, $C_{2-10}$-alkynyl, $C_{6-14}$-aryl and monovalent 5 to 14 membered aromatic heterocyclic residue;
$R^e$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR³, C₁₋₁₀-alkyl, C₂₋₁₀-alkenyl, C₂₋₁₀-alkynyl, C₃₋₁₀-cycloalkyl, C₅₋₁₀-cycloalkenyl and monovalent 3 to 14 membered aliphatic heterocyclic residue,
wherein R³ and R⁴ at each occurrence are independently from each other selected from the group consisting of C₁₋₁₀-alkyl, C₂₋₁₀-alkenyl, C₂₋₁₀-alkynyl, C₃₋₁₀-cycloalkyl, C₅₋₁₀-cycloalkenyl, monovalent 3 to 14 membered aliphatic heterocyclic residue, C₆₋₁₄-aryl and monovalent 5 to 14 membered aromatic heterocyclic residue, G¹ and G² are independently from each other C₆₋₁₄-arylene optionally substituted with 1 to 6 substituents Rᵃ or bivalent 5 to 14 membered aromatic heterocyclic residue optionally substituted with 1 to 6 substituents Rᵃ,
wherein
Rᵃ at each occurrence are independently from each other selected from the group consisting of =O, =C(CN)₂, —O—C₂₋₆-alkylene-O—, halogen, —CN, —NO₂, —OH, C₁₋₃₀-alkoxy, —O—CH₂CH₂O—C₁₋₃₀-alkyl, —O—COR⁸, —S—C₁₋₃₀-alkyl, —NH₂, —NHR⁸, —NR⁸R⁹, —NH—COR⁸, —COOH, —COOR⁸, —CONH₂, —CONHR⁸, —CONR⁸R⁹, —CO—H, —COR⁸, C₁₋₃₀-alkyl optionally substituted with 1 to 6 substituents Rᶠ, C₂₋₃₀-alkenyl optionally substituted with 1 to 6 substituents Rᶠ, C₂₋₃₀-alkynyl optionally substituted with 1 to 6 substituents Rᶠ, C₃₋₁₀-cycloalkyl optionally substituted with 1 to 6 substituents Rᵍ, C₅₋₁₀-cycloalkenyl optionally substituted with 1 to 6 substituents Rᵍ and monovalent 3 to 14 membered aliphatic heterocyclic residue optionally substituted with 1 to 6 substituents Rᵍ,
wherein
R⁸ and R⁹ at each occurrence are independently from each other selected from the group consisting of C₁₋₃₀-alkyl, C₂₋₃₀-alkenyl, C₂₋₃₀-alkynyl, C₃₋₁₀-cycloalkyl, C₅₋₁₀-cycloalkenyl, monovalent 3 to 14 membered aliphatic heterocyclic residue, C₆₋₁₄-aryl and monovalent 5 to 14 membered aromatic heterocyclic residue,
Rᶠ at each occurrence are independently from each other selected from the group consisting of =O, =C(CN)₂, —O—C₂₋₆-alkylene-O—, halogen, —CN, —NO₂, —OH, C₁₋₁₀-alkoxy, —O—CH₂CH₂O—C₁₋₁₀-alkyl, —O—COR¹⁹, —S—C₁₋₁₀-alkyl, —NH₂, —NHR¹⁰, —NR¹⁰R¹¹, —NH—COR¹⁰, —COOH, —COOR¹⁰, —CONH₂, —CONHR¹⁰, —CONR¹⁹R¹¹, —CO—H, —COR¹⁰, C₃₋₁₀-cycloalkyl, monovalent 3 to 14 membered aliphatic heterocyclic residue, C₆₋₁₄-aryl and monovalent 5 to 14 membered aromatic heterocyclic residue;
Rᵍ at each occurrence are independently from each other selected from the group consisting of =O, =C(CN)₂, —O—C₂₋₆-alkylene-O—, halogen, —CN, —NO₂, —OH, C₁₋₁₀-alkoxy, —O—CH₂CH₂O—C₁₋₁₀-alkyl, —O—COR¹⁰, —S—C₁₋₁₀-alkyl, —NH₂, —NHR¹⁰, —NR¹⁰R¹¹, —NH—COR¹⁰, —COOH, —COOR¹⁰, —CONH₂, —CONHR¹⁰, —CONR¹⁹R¹¹, —CO—H, —COR¹⁰, C₁₋₁₀-alkyl, C₂₋₁₀-alkenyl, C₂₋₁₀-alkynyl, C₆₋₁₄-aryl and monovalent 5 to 14 membered aromatic heterocyclic residue;
wherein R¹⁰ and R¹¹ at each occurrence are independently from each other selected from the group consisting of C₁₋₁₀-alkyl, C₂₋₁₀-alkenyl, C₂₋₁₀-alkynyl, C₃₋₁₀-cycloalkyl, C₅₋₁₀-cycloalkenyl, monovalent 3 to 14 membered aliphatic heterocyclic residue, C₆₋₁₄-aryl and monovalent 5 to 14 membered aromatic heterocyclic residue, or
G¹ and G² are independently from each other

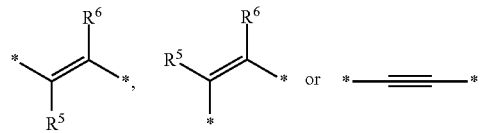

wherein
R⁵ and R⁶ are independently from each other H or C₁₋₃₀-alkyl,
L is C₆₋₂₄-arylene optionally substituted with 1 to 6 substituents Rᵇ or bivalent 5 to 24 membered aromatic heterocyclic residue optionally substituted with 1 to 6 substituents Rᵇ,
wherein
Rᵇ at each occurrence are independently from each other selected from the group consisting of =O, =C(CN)₂, —O—C₂₋₆-alkylene-O—, halogen, —CN, —NO₂, —OH, C₁₋₃₀-alkoxy, —O—CH₂CH₂O—C₁₋₃₀-alkyl, —O—COR¹², —S—C₁₋₃₀-alkyl, —NH₂, —NHR¹², —NR¹²R¹³, —NH—COR¹², —COOH, —COOR¹², —CONH₂, —CONHR¹², —CONR¹²R¹³, —CO—H, —COR¹², C₁₋₃₀-alkyl optionally substituted with 1 to 6 substituents Rʰ, C₂₋₃₀-alkenyl optionally substituted with 1 to 6 substituents Rʰ, C₂₋₃₀-alkynyl optionally substituted with 1 to 6 substituents Rʰ, C₃₋₁₀-cycloalkyl optionally substituted with 1 to 6 substituents C₅₋₁₀-cycloalkenyl optionally substituted with 1 to 6 substituents Rⁱ and monovalent 3 to 14 membered aliphatic heterocyclic residue optionally substituted with 1 to 6 substituents Rⁱ,
wherein
R¹² and R¹³ at each occurrence are independently from each other selected from the group consisting of C₁₋₃₀-alkyl, C₂₋₃₀-alkenyl, C₂₋₃₀-alkynyl, C₃₋₁₀-cycloalkyl, C₅₋₁₀-cycloalkenyl, monovalent 3 to 14 membered aliphatic heterocyclic residue, C₆₋₁₄-aryl and monovalent 5 to 14 membered aromatic heterocyclic residue,
Rʰ at each occurrence are independently from each other selected from the group consisting of =O, =C(CN)₂, —O—C₂₋₆-alkylene-O—, halogen, —CN, —NO₂, —OH, C₁₋₁₀-alkoxy, —O—CH₂CH₂O—C₁₋₁₀-alkyl, —O—COR¹⁴, —S—C₁₋₁₀-alkyl, —NH₂, —NHR¹⁴, —NR¹⁴R¹⁵, —NH—COR¹⁴, —COOH, —COOR¹⁴, —CONH₂, —CONHR¹⁴, —CONR¹⁴R¹⁵, —CO—H, —COR¹⁴, C₃₋₁₀-cycloalkyl, monovalent 3 to 14 membered aliphatic heterocyclic residue, C₆₋₁₄-aryl and monovalent 5 to 14 membered aromatic heterocyclic residue;
Rⁱ at each occurrence are independently from each other selected from the group consisting of =O, =C(CN)₂, —O—C₂₋₆-alkylene-O—, halogen, —CN, —NO₂, —OH, C₁₋₁₀-alkoxy, —O—CH₂CH₂O—C₁₋₁₀-alkyl, —O—COR¹⁴, —S—C₁₋₁₀-alkyl, —NH₂, —NHR¹⁴, —NR¹⁴R¹⁵, —NH—COR¹⁴, —COOH, —COOR¹⁴, —CONH₂, —CONHR¹⁴, —CONR¹⁴R¹⁵, —CO—H, —COR¹⁴, C₁₋₁₀-alkyl, C₂₋₁₀-alkenyl, C₂₋₁₀-alkynyl, C₆₋₁₄-aryl and monovalent 5 to 14 membered aromatic heterocyclic residue;
wherein R¹⁴ and R¹⁵ at each occurrence are independently from each other selected from the group consisting of C₁₋₁₀-alkyl, C₂₋₁₀-alkenyl, C₂₋₁₀-alkynyl, C₃₋₁₀-cycloalkyl, C₆₋₁₀-cycloalkenyl, monovalent 3 to 14 membered aliphatic heterocyclic residue, $C_{6-14}$-aryl and monovalent 5 to 14 membered aromatic heterocyclic residue, or L is

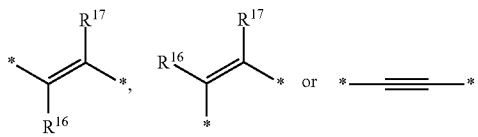

wherein
$R^{16}$ and $R^{17}$ are independently from each other H, $C_{1-30}$-alkyl, —CN or halogen,
q and s are independently from each other 0, 1, 2, 3, 4 or 5,
r is 0, 1 or 2,
and
n is an integer from 2 to 10,000.

$C_{1-12}$-alkyl, $C_{1-16}$-alkyl, $C_{6-20}$-alkyl and $C_{1-30}$-alkyl can be branched or unbranched. Examples of $C_{1-12}$-alkyl are $C_{1-10}$-alkyl and n-undecyl and n-dodecyl. Examples of $C_{1-16}$-alkyl are $C_{1-12}$-alkyl and n-tridecyl, n-tetradecyl, n-pentadecyl and n-hexadecyl. Examples of $C_{1-30}$-alkyl are $C_{1-10}$-alkyl, and n-undecyl, n-dodecyl, n-tridecyl, n-tetradecyl, n-pentadecyl, n-hexadecyl, n-heptadecyl, n-octadecyl, n-nonadecyl and n-icosyl ($C_{20}$), n-docosyl ($C_{22}$), n-tetracosyl ($C_{24}$), n-hexacosyl ($C_{26}$), n-octacosyl ($C_{28}$) and n-triacontyl ($C_{30}$). Examples of $C_{6-20}$-alkyl are n-hexyl, n-heptyl, n-octyl, n-(2-ethyl)hexyl, n-nonyl, n-decyl, n-undecyl, n-dodecyl, n-undecyl, n-dodecyl, n-tridecyl, n-tetradecyl, n-pentadecyl, n-hexadecyl, n-heptadecyl, n-octadecyl, n-nonadecyl and n-icosyl ($C_{20}$)

$C_{2-10}$-alkenyl and $C_{2-30}$-alkenyl can be branched or unbranched. Examples of $C_{2-10}$-alkenyl are vinyl, propenyl, cis-2-butenyl, trans-2-butenyl, 3-butenyl, cis-2-pentenyl, trans-2-pentenyl, cis-3-pentenyl, trans-3-pentenyl, 4-pentenyl, 2-methyl-3-butenyl, hexenyl, heptenyl, octenyl, nonenyl and docenyl. Examples of $C_{2-30}$-alkenyl are $C_{2-10}$-alkenyl, and linoleyl ($C_{18}$), linolenyl ($C_{18}$), oleyl ($C_{18}$), arachidonyl ($C_{20}$), and erucyl ($C_{22}$).

$C_{2-10}$-alkynyl and $C_{2-30}$-alkynyl can be branched or unbranched. Examples of $C_{2-10}$-alkynyl are ethynyl, 2-propynyl, 2-butynyl, 3-butynyl, pentynyl, hexynyl, heptynyl, octynyl, nonynyl and decynyl. Examples of $C_{2-30}$-alkynyl are $C_{2-10}$-alkynyl, and undecynyl, dodecynyl, undecynyl, dodecynyl, tridecynyl, tetradecynyl, pentadecynyl, hexadecynyl, heptadecynyl, octadecynyl, nonadecynyl and icosynyl ($C_{20}$).

Examples of $C_{3-10}$-cycloalkyl are preferably monocyclic $C_{3-10}$-cycloalkyls such as cyclopropyl, cyclobutyl, cyclopentyl, cyclohexyl, cycloheptyl and cyclooctyl, but include also polycyclic $C_{3-10}$-cycloalkyls such as decalinyl, norbornyl and adamantyl.

Examples of $C_{5-10}$-cycloalkenyl are preferably monocyclic $C_{5-10}$-cycloalkenyls such as cyclopentenyl, cyclohexenyl, cyclohexadienyl and cycloheptatrienyl, but include also polycyclic $C_{5-10}$-cycloalkenyls.

Examples of monovalent 3 to 14 membered aliphatic heterocyclic residues are monocyclic monovalent 3 to 8 membered aliphatic cyclic residues and polycyclic, for example bicyclic monovalent 7 to 12 membered aliphatic heterocyclic residues.

Examples of monocyclic monovalent 3 to 8 membered aliphatic heterocyclic residues are monocyclic monovalent 5 membered aliphatic heterocyclic residues containing one heteroatom such as pyrrolidinyl, 1-pyrrolinyl, 2-pyrrolinyl, 3-pyrrolinyl, tetrahydrofuryl, 2,3-dihydrofuryl, tetrahydrothiophenyl and 2,3-dihydrothiophenyl, monocyclic monovalent 5 membered aliphatic heterocyclic residues containing two heteroatoms such as imidazolidinyl, imidazolinyl, pyrazolidinyl, pyrazolinyl, oxazolidinyl, oxazolinyl, isoxazolidinyl, isoxazolinyl, thiazolidinyl, thiazolinyl, isothiazolidinyl and isothiazolinyl, monocyclic monovalent 5 membered aliphatic heterocyclic residues containing three heteroatoms such as 1,2,3-triazolyl, 1,2,4-triazolyl and 1,4,2-dithiazolyl, monocyclic monovalent 6 membered aliphatic heterocyclic residues containing one heteroatom such as piperidyl, piperidino, tetrahydropyranyl, pyranyl, thianyl and thiopyranyl, monocyclic monovalent 6 membered aliphatic heterocyclic residues containing two heteroatoms such as piperazinyl, morpholinyl and morpholino and thiazinyl, monocyclic monovalent 7 membered aliphatic heterocyclic residues containing one hereoatom such as azepanyl, azepinyl, oxepanyl, thiepanyl, thiapanyl, thiepinyl, and monocyclic monovalent 7 membered aliphatic heterocyclic residues containing two hereoatom such as 1,2-diazepinyl and 1,3-thiazepinyl.

An example of a bicyclic monovalent 7-12 membered aliphatic heterocyclic residue is decahydronaphthyl.

$C_{6-14}$-aryl can be monocyclic or polycyclic. Examples of $C_{6-14}$-aryl are monocyclic $C_6$-aryl such as phenyl, bicyclic $C_{9-10}$-aryl such as 1-naphthyl, 2-naphthyl, indenyl, indanyl and tetrahydronaphthyl, and tricyclic $C_{12-14}$-aryl such as anthryl, phenanthryl, fluorenyl and s-indacenyl.

The monovalent 5 to 14 membered aromatic heterocyclic residues can be monocyclic monovalent 5 to 8 membered aromatic heterocyclic residues, or polycyclic, for example bicyclic monovalent 7 to 12 membered, tricyclic monovalent 9 to 14 membered aromatic heterocyclic residue, or tetracyclic monovalent 9 to 14 membered aromatic heterocyclic residues.

Examples of monocyclic monovalent 5 to 8 membered aromatic heterocyclic residues are monocyclic monovalent 5 membered aromatic heterocyclic residues containing one heteroatom such as pyrrolyl, furyl and thiophenyl, monocyclic monovalent 5 membered aromatic heterocyclic residues containing two heteroatoms such as imidazolyl, pyrazolyl, oxazolyl, isoxazolyl, thiazolyl, isothiazolyl, monocyclic monovalent 5 membered aromatic heterocyclic residues containing three heteroatoms such as 1,2,3-triazolyl, 1,2,4-triazolyland oxadiazolyl, monocyclic monovalent 5 membered aromatic heterocyclic residues containing four heteroatoms such as tetrazolyl, monocyclic monovalent 6 membered aromatic heterocyclic residues containing one heteroatom such as pyridyl, monocyclic monovalent 6 membered aromatic heterocyclic residues containing two heteroatoms such as pyrazinyl, pyrimidinyl and pyridazinyl, monocyclic monovalent 6 membered aromatic heterocyclic residues containing three heteroatoms such as 1,2,3-triazinyl, 1,2,4-triazinyl and 1,3,5-triazinyl, monocyclic monovalent 7 membered aromatic heterocyclic residues containing one heteroatom such as azepinyl, and monocyclic monovalent 7 membered aromatic heterocyclic residues containing two heteroatoms such as 1,2-diazepinyl.

Examples of bicyclic monovalent 7 to 12 membered aromatic heterocyclic residues are bicyclic monovalent 8 membered aromatic heterocyclic residues containing two heteroatoms such as thieno[3,2-b]thiophenyl, bicyclic 9 membered aromatic heterocyclic residues containing one heteroatom such as indolyl, isoindolyl, indolizinyl, indolinyl, benzofuryl, isobenzofuryl, benzothiophenyl and isobenzothiophenyl, bicyclic monovalent 9 membered aromatic heterocyclic residues containing two heteroatoms such as indazolyl, benzimidazolyl, benzimidazolinyl, benzoxazolyl, benzisooxazolyl, benzthiazolyl, benzisothiazolyl, furopyridyl and thienopyridyl, bicyclic monovalent 9 membered aromatic heterocyclic residues containing three heteroatoms such as benzotriazolyl, benzoxadiazolyl, oxazolopyridyl, isooxazolopyridyl, thiazolopyridyl, isothiazolopyridyl and imidazopyridyl, bicyclic monovalent 9 membered aromatic heterocyclic residues containing four heteroatoms such as purinyl, bicyclic monovalent 10 membered aromatic heterocyclic residues containing one heteroatom such as quinolyl, isoquinolyl, chromenyl and chromanyl, bicyclic monovalent 10 membered aromatic heterocyclic residues containing two heteroatoms such as quinoxalinyl, quinazolinyl, cinnolinyl, phthalazinyl, 1,5-naphthyridinyl and 1,8-naphthyridinyl, bicyclic monovalent 10 membered aromatic heterocyclic residues containing three heteroatoms such as pyridopyrazinyl, pyridopyrimidinyl and pyridopyridazinyl, and bicyclic monovalent 10 membered aromatic heterocyclic residues containing four heteroatoms such as pteridinyl.

Examples of tricyclic monovalent 9 to 14 membered aromatic heterocyclic residues are dibenzofuryl, acridinyl, phenoxazinyl, 7H-cyclopenta[1,2-b:3,4-b]dithiophenyl and 4H-cyclopenta[2,1-b:3,4-b']dithiophenyl. An example of a tricyclic monovalent 9 to 14 membered aromatic heterocyclic residue containing three heteroatoms is dithienothiophenyl of formula

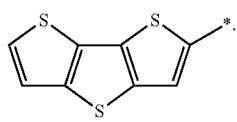

An example of a tetracyclic monovalent 9 to 14 membered aromatic heterocyclic residue containing four heteroatoms is trithienothiophenyl of formula

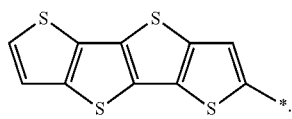

Examples of halogen are —F, —Cl, —Br and —I.

Examples of $C_{1-10}$-alkoxy are methoxy, ethoxy, n-propoxy, isopropoxy, n-butoxy, sec-butoxy, isobutoxy, tert-butoxy, n-pentoxy, neopentoxy, isopentoxy, hexoxy, n-heptoxy, n-octoxy, n-nonoxy and n-decoxy. Examples of $C_{1-30}$-alkoxy are $C_{1-10}$-alkoxy, and n-undecoxy, n-dodecoxy, n-undecoxy, n-dodecoxy, n-tridecoxy, n-tetradecoxy, n-pentadecoxy, n-hexadecoxy, n-heptadecoxy, n-octadecoxy, n-nonadecoxy and n-icosoxy ($C_{20}$), n-docosoxy ($C_{22}$), n-tetracosoxy ($C_{24}$), n-hexacosoxy ($C_{26}$), n-octacosoxy ($C_{28}$) and n-triacontoxy ($C_{30}$).

Examples of $C_{2-6}$-alkylene are ethylene, butylene, pentylene, hexylene and 2-methylpentylene.

Examples of $C_{6-14}$-arylene are monocyclic $C_6$-arylene such as phenylene, bicyclic $C_{9-10}$-arylene such as naphthylene, for example

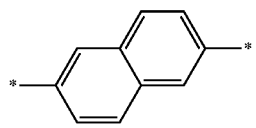

indenylene, for example

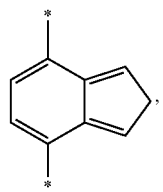

indanylene, for example

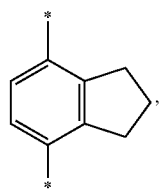

and tetrahydronaphthylene, for example

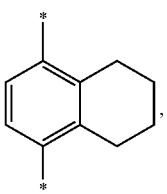 [SMILES: *c1ccc(*)c2c1CCCC2]

and tricyclic $C_{12-14}$-arylene such as anthrylene, for example

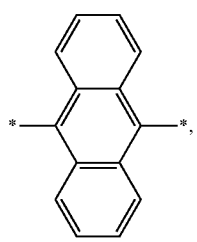

phenanthrylene, for example

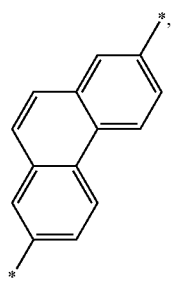
fluorenylene, for example
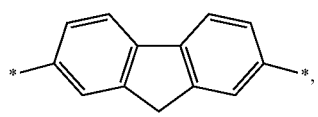
and
s-indacenylene, for example
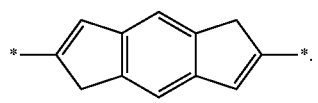
Examples of $C_{6-24}$-arylene are $C_{6-14}$-arylene and
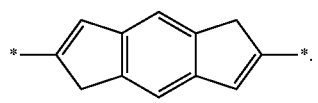
pyrenylene, for example
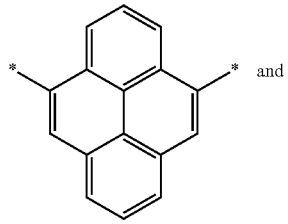 and 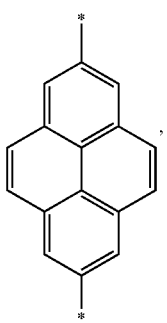
tetracenylene, for example
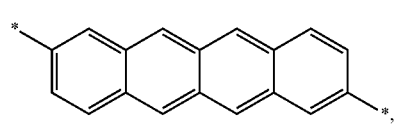
perylenylene, for example
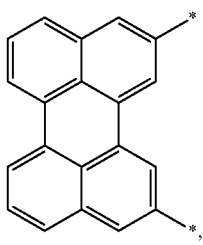
indenofluorenylene, for example
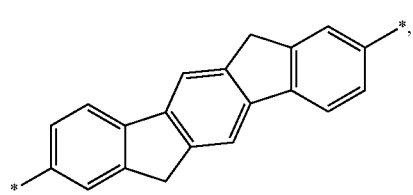
pentacenylene, for example
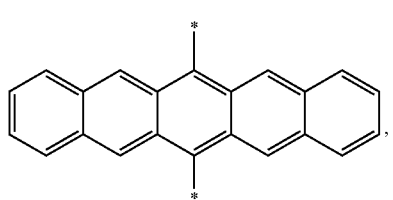 [SMILES: *c1c2cc3ccccc3cc2c(*)c2cc3ccccc3cc12]
coronenylene, for example
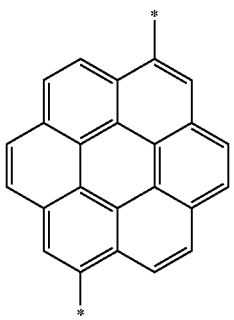 [SMILES: *c1cc2ccc3ccc4c(*)cc5ccc6ccc1c1c6c5c4c3c21]
and tetraphenylenylene, for example
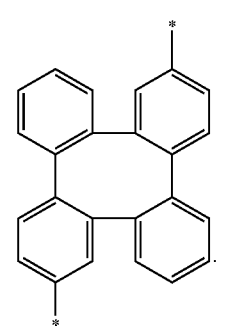 [SMILES: *c1ccc2c(c1)-c1ccccc1-c1ccc(*)cc1-c1ccccc1-2]

The bivalent 5 to 14 membered aromatic heterocyclic residues can be monocyclic bivalent 5 to 8 membered aromatic heterocyclic residues, or polycyclic, for example bicyclic bivalent 7 to 14 membered, tricyclic bivalent 9 to 14 membered aromatic heterocyclic residues, or tetracyclic bivalent 9 to 14 membered aromatic heterocyclic residues.

Examples of monocyclic bivalent 5 to 8 membered aromatic heterocyclic residues are monocyclic bivalent 5 membered aromatic heterocyclic residues containing one heteroatom such as pyrrolylene, furylene and thiophenylene, monocyclic bivalent 5 membered aromatic heterocyclic residues containing two heteroatoms such as imidazolylene, pyrazolylene, oxazolylene, isoxazolylene, thiazolylene, isothiazolylene, monocyclic bivalent 5 membered aromatic heterocyclic residues containing three heteroatoms such as 1,2,3-triazolylene, 1,2,4-triazolylene and oxadiazolylene, monocyclic bivalent 5 membered aromatic heterocyclic residues containing four heteroatoms such as tetrazolylene, monocyclic bivalent 6 membered aromatic heterocyclic residues containing one heteroatom such as pyridylene, monocyclic bivalent 6 membered aromatic heterocyclic residues containing two heteroatoms such as pyrazinylene, pyrimidinylene and pyridazinylene, monocyclic bivalent 6 membered aromatic heterocyclic residues containing three heteroatoms such as 1,2,3-triazinylene, 1,2,4-triazinylene and 1,3,5-triazinylene, monocyclic bivalent 7 membered aromatic heterocyclic residues containing one heteroatom such as azepinylene, and monocyclic bivalent 7 membered aromatic heterocyclic residues containing two heteroatoms such as 1,2-diazepinylene.

Examples of bicyclic bivalent 7 to 14 membered aromatic heterocyclic residues are bicyclic bivalent 8 membered aromatic heterocyclic residues containing two heteroatoms such as thienothiophenylene, for example

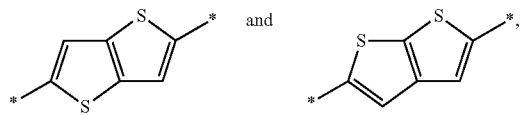 and bicyclic bivalent 8 membered aromatic heterocyclic residues containing three heteroatoms such as as thienothiazolylene, for example

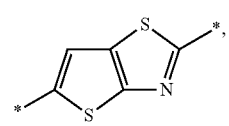

bicyclic bivalent 8 membered aromatic heterocyclic residues containing four heteroatoms such as thiazothiazolylene, for example

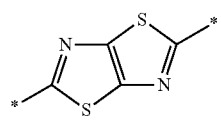 [SMILES: *c1nc2sc(*)nc2s1]

bicyclic bivalent 9 membered aromatic heterocyclic residues containing one heteroatom such as indolylene, isoindolylene, indolizinylene, indolinylene, isoindolinylene, for example

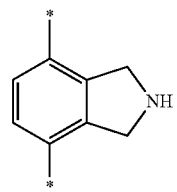 [SMILES: *c1ccc(*)c2c1CNC2]

benzofurylene, isobenzofurylene, benzothiophenylene and isobenzothiophenylene, bicyclic bivalent 9 membered aromatic heterocyclic residues containing two heteroatoms such as indazolylene, benzimidazolylene, benzimidazolinylene, benzoxazolylene, benzisooxazolylene, benzthiazolylene, benzisothiazolylene, furopyridylene and thienopyridylene, bicyclic bivalent 9 membered aromatic heterocyclic residues containing three heteroatoms such as benzotriazolylene, benzoxadiazolylene, oxazolopyridylene, isooxazolopyridylene, thiazolopyridylene, isothiazolopyridylene, imidazopyridylene, benzothiadiazolylene, for example

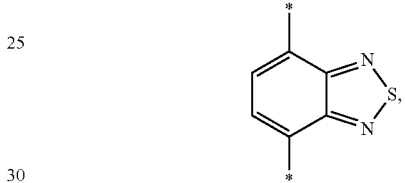

and dioxanothiophenylene, for example

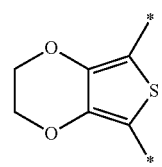 [SMILES: *c1sc(*)c2c1OCCO2]

bicyclic bivalent 9 membered aromatic heterocyclic residues containing four heteroatoms such as purinylene, bicyclic bivalent 10 membered aromatic heterocyclic residues containing one heteroatom such as quinolylene, isoquinolylene, chromenylene and chromanylene, bicyclic bivalent 10 membered aromatic heterocyclic residues containing two heteroatoms such as quinoxalinylene, for example

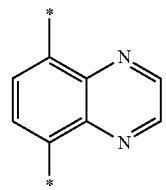 [SMILES: *c1ccc(*)c2nccnc12]

quinazolinylene, cinnolinylene, phthalazinylene, 1,5-naphthyridinylene and 1,8-naphthyridinylene, bicyclic bivalent 10 membered aromatic heterocyclic residues containing three heteroatoms such as pyridopyrazinylene, pyridopyrimidinylene and pyridopyridazinylene, and bicyclic bivalent 10 membered aromatic heterocyclic residues containing four heteroatoms such as pteridinylene.

Examples of tricyclic bivalent 9 to 14 membered aromatic heterocyclic residues containing one heteroatom are dibenzofurylene, acridinylene, dibenzosilacyclopentadienylene, for example

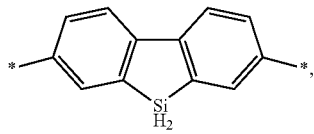

and dibenzopyrrolylene, for example

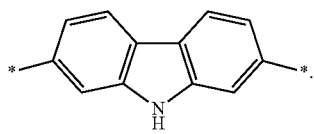

Examples of a tricyclic bivalent 9 to 14 membered aromatic heterocyclic residues containing two heteroatoms are phenoxazinylene, and the following compounds

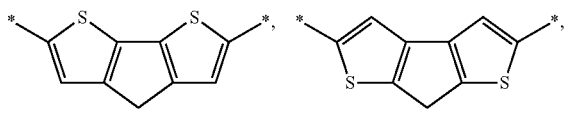

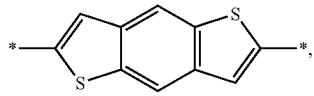

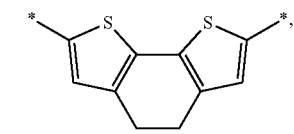

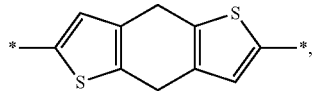

Examples of tricyclic bivalent 9 to 14 membered aromatic heterocyclic residue containing three heteroatoms are the following compounds

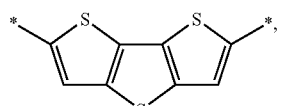

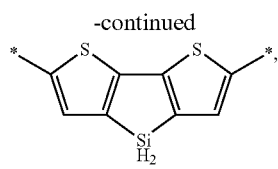

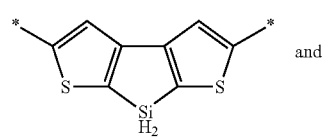

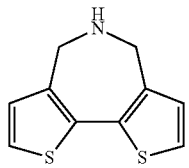

Examples of tricyclic bivalent 9 to 14 membered aromatic heterocyclic residue containing four-heteroatoms are the following compounds

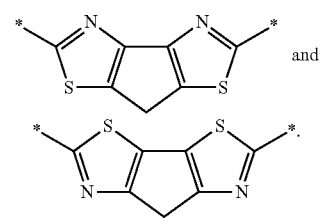

An example of a tricyclic bivalent 9 to 14 membered aromatic heterocyclic residue containing six heteroatoms is the following compound

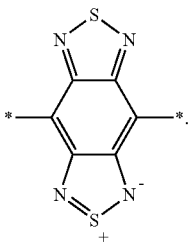

An example of a tetracyclic bivalent 9 to 14 membered aromatic heterocyclic residue containing four heteroatoms is the following compound

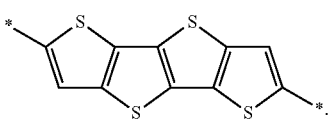

Examples of bivalent 5 to 24 membered aromatic heterocyclic residues are bivalent 5 to 14 membered aromatic heterocyclic residues, and the following compounds

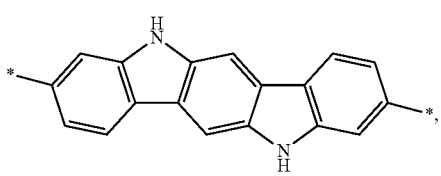
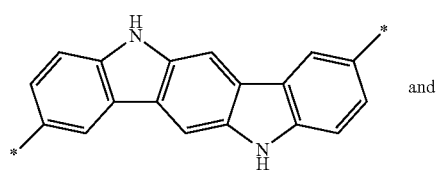 and
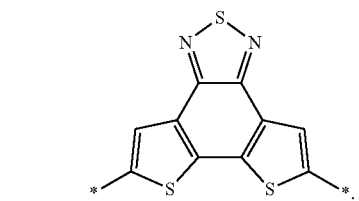
Examples of L are:
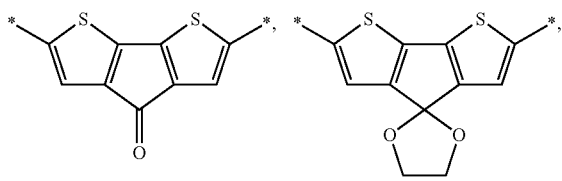
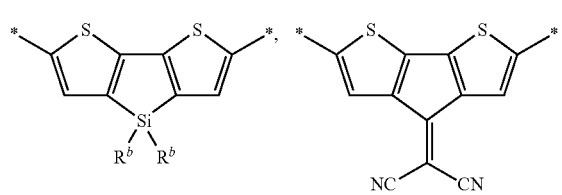
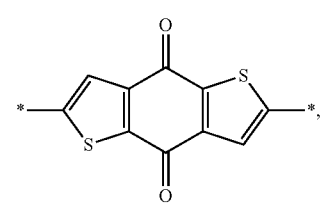
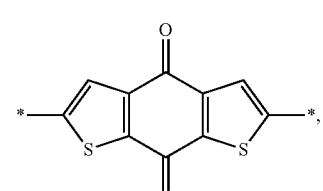
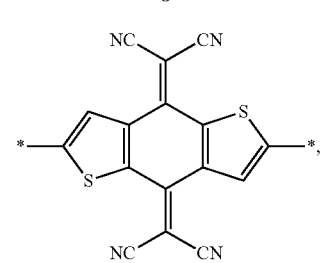
-continued
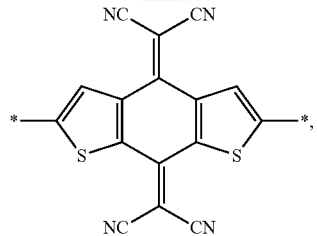
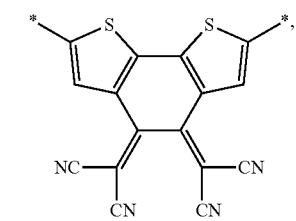
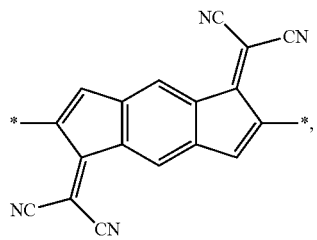
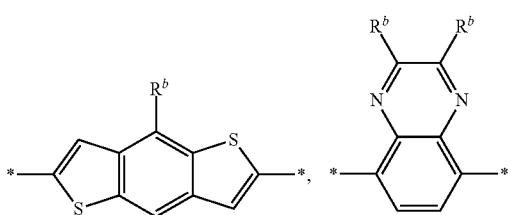
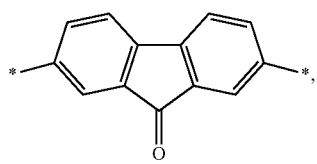
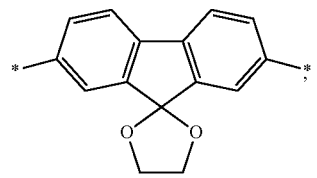
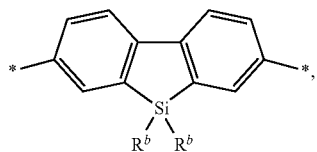
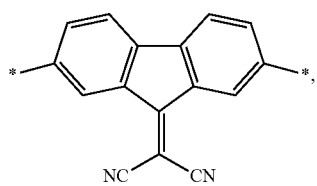

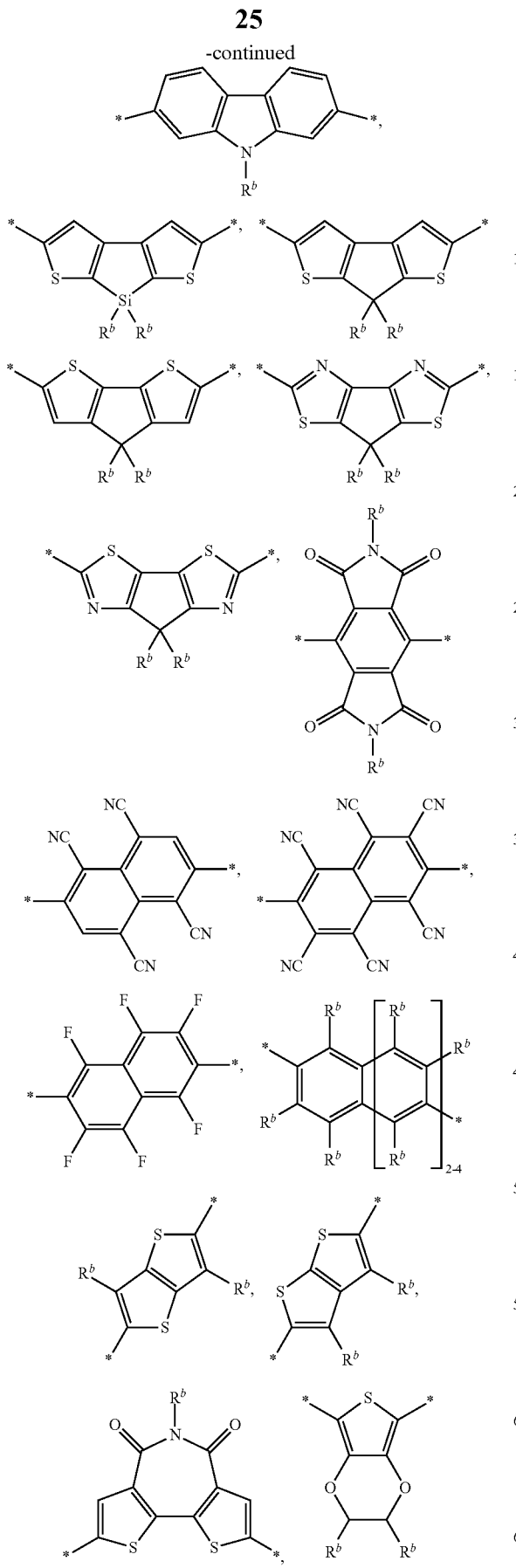
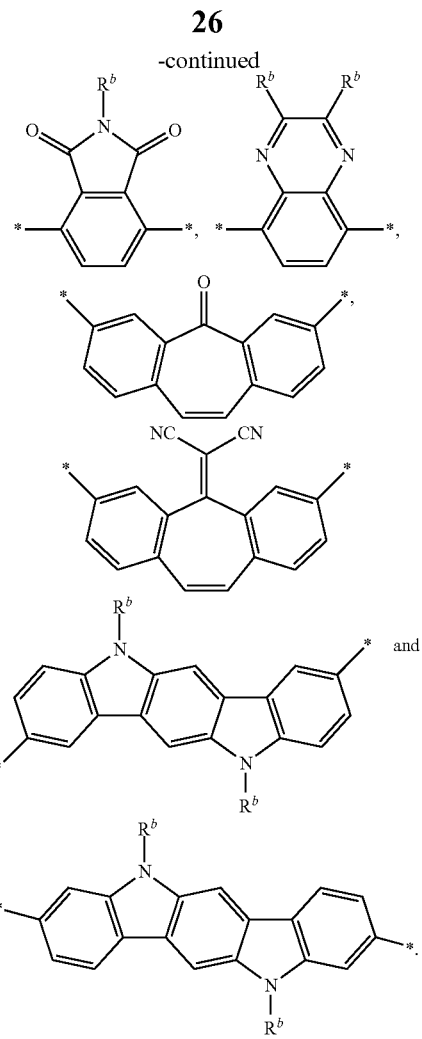

In preferred units of formula (1)

$R^1$ and $R^2$ are independently from each other H, $C_{1-30}$-alkyl optionally substituted with 1 to 6 substituents $R^c$, $C_{2-30}$-alkenyl optionally substituted with 1 to 6 substituents $R^c$, $C_{2-30}$-alkynyl optionally substituted with 1 to 6 substituents $R^c$, $C_{3-10}$-cycloalkyl optionally substituted with 1 to 6 substituents $R^d$, $C_{5-10}$-cycloalkenyl or $C_{6-14}$-aryl optionally substituted with 1 to 6 substituents $R^e$, wherein $R^c$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{3-10}$-cycloalkyl, monovalent 3 to 14 membered aliphatic heterocyclic residue, C$_{6-14}$-aryl and monovalent 5 to 14 membered aromatic heterocyclic residue;

$R^d$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR³, C$_{1-10}$-alkyl, C$_{2-10}$-alkenyl, C$_{2-10}$-alkynyl, C$_{6-14}$-aryl and monovalent 5 to 14 membered aromatic heterocyclic residue;

R$^e$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR³, —S—C$_{1-10}$-alkyl, —NH$_2$, —NHR³, —NR³R⁴, —NH—COR³, —COOH, —COOR³, —CONH$_2$, —CONHR³, —CONR³R⁴, —CO—H, —COR³, C$_{1-10}$-alkyl, C$_{2-10}$-alkenyl, C$_{2-10}$-alkynyl, C$_{3-10}$-cycloalkyl, C$_{5-10}$-cycloalkenyl and monovalent 3 to 14 membered aliphatic heterocyclic residue, wherein R³ and R⁴ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, G¹ and G² are independently from each other C$_{6-14}$-arylene optionally substituted with 1 to 6 substituents R$^a$ or bivalent 5 to 14 membered aromatic heterocyclic residue optionally substituted with 1 to 6 substituents R$^a$, wherein R$^a$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR⁸, —S—C$_{1-30}$-alkyl, —NH$_2$, —NHR⁸, —NR⁸R⁹, —NH—COR⁸, —COOH, —COOR⁸, —CONH$_2$, —CONHR⁸, —CONR⁸R⁹, —CO—H, —COR⁸, C$_{1-30}$-alkyl optionally substituted with 1 to 6 substituents R$^f$, C$_{2-30}$-alkenyl optionally substituted with 1 to 6 substituents R$^f$, C$_{2-30}$-alkynyl optionally substituted with 1 to 6 substituents R$^f$, C$_{3-10}$-cycloalkyl optionally substituted with 1 to 6 substituents R$^g$, C$_{5-10}$-cycloalkenyl optionally substituted with 1 to 6 substituents R$^g$ and monovalent 3 to 14 membered aliphatic heterocyclic residue optionally substituted with 1 to 6 substituents R$^g$, wherein R⁸ and R⁹ at each occurrence are independently from each other selected from the group consisting of C$_{1-30}$-alkyl, C$_{2-30}$-alkenyl, C$_{2-30}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, R$^f$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR¹⁰, —S—C$_{1-10}$-alkyl, —NH$_2$, —NHR¹⁰, —NR¹⁰R¹¹, —NH—COR¹⁰, —COOH, —COOR¹⁰, —CONH$_2$, —CONHR¹⁰, —CONR¹⁰R¹¹, —CO—H, —COR¹⁰, C$_{3-10}$-cycloalkyl, monovalent 3 to 14 membered aliphatic heterocyclic residue, C$_{6-14}$-aryl and monovalent 5 to 14 membered aromatic heterocyclic residue;

R$^g$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR¹⁰, —S—C$_{1-10}$-alkyl, —NH$_2$, —NHR¹⁰, —NR¹⁰R¹¹, —NH—COR¹⁰, —COOH, —COOR¹⁰, —CONH$_2$, —CONHR¹⁰, —CONR¹⁹R¹¹, —CO—H, —COR¹⁰, C$_{1-10}$-alkyl, C$_{2-10}$-alkenyl, C$_{2-10}$-alkynyl, C$_{6-14}$-aryl and monovalent 5 to 14 membered aromatic heterocyclic residue;

wherein R¹⁰ and R¹¹ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, or G¹ and G² are independently from each other

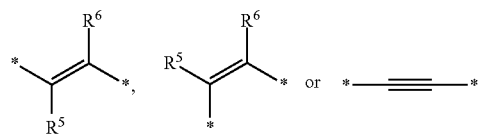

wherein

R⁵ and R⁶ are independently from each other H or C$_{1-30}$-alkyl,

L is C$_{6-24}$-arylene optionally substituted with 1 to 6 substituents R$^b$ or bivalent 5 to 24 membered aromatic heterocyclic residue optionally substituted with 1 to 6 substituents R$^b$, wherein R$^b$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR¹², —S—C$_{1-30}$-alkyl, —NH$_2$, —NHR¹², —NR¹²R¹³, —NH—COR¹², —COOH, —COOR¹², —CONH$_2$, —CONHR¹², —CONR¹²R¹³, —CO—H, —COR¹², C$_{1-30}$-alkyl optionally substituted with 1 to 6 substituents R$^h$, C$_{2-30}$-alkenyl optionally substituted with 1 to 6 substituents R$^h$, C$_{2-30}$-alkynyl optionally substituted with 1 to 6 substituents R$^h$, C$_{3-10}$-cycloalkyl optionally substituted with 1 to 6 substituents R$^i$, C$_{5-10}$-cycloalkenyl optionally substituted with 1 to 6 substituents R$^i$ and monovalent 3 to 14 membered aliphatic heterocyclic residue optionally substituted with 1 to 6 substituents R$^i$, wherein R¹² and R¹³ at each occurrence are independently from each other selected from the group consisting of C$_{1-30}$-alkyl, C$_{2-30}$-alkenyl, C$_{2-30}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, R$^h$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR¹⁴, —S—C$_{1-10}$-alkyl, —NH$_2$, —NHR¹⁴, —NR¹⁴R¹⁵, —NH—COR¹⁴, —COOH, —COOR¹⁴, —CONH$_2$, —CONHR¹⁴, —CONR¹⁴R¹⁵, —CO—H, —COR¹⁴, C$_{3-10}$-cycloalkyl, monovalent 3 to 14 membered aliphatic heterocyclic residue, C$_{6-14}$-aryl and monovalent 5 to 14 membered aromatic heterocyclic residue;

R$^i$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^{14}$, —S—C$_{1-10}$-alkyl, —NH$_2$, —NHR$^{14}$, —NR$^{14}$R$^{15}$, —NH—COR$^{14}$, —COOH, —COOR$^{14}$, —CONH$_2$, —CONHR$^{14}$, —CONR$^{14}$R$^{15}$, —CO—H, —COR$^{14}$, C$_{1-10}$-alkyl, C$_{2-10}$-alkenyl, C$_{2-10}$-alkynyl, C$_{6-14}$-aryl and monovalent 5 to 14 membered aromatic heterocyclic residue;

wherein R$^{14}$ and R$^{15}$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, Or L is

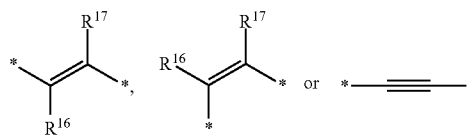

wherein
R$^{16}$ and R$^{17}$ are independently from each other H, C$_{1-30}$-alkyl, —CN or halogen,
q and s are independently from each other 0, 1, 2, 3, 4 or 5,
r is 0, 1 or 2,
and
n is an integer from 2 to 10,000.

In more preferred units of formula (1)
R$^1$ and R$^2$ are independently from each other C$_{1-30}$-alkyl optionally substituted with 1 to 6 substituents R$^c$, preferably C$_{1-16}$-alkyl optionally substituted with 1 to 6 substituents R$^c$, more preferably C$_{1-12}$-alkyl optionally substituted with 1 to 6 substituents R$^c$, wherein
R$^c$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^3$, —S—C$_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, C$_{3-10}$-cycloalkyl, monovalent 3 to 14 membered aliphatic heterocyclic residue, C$_{6-14}$-aryl and monovalent 5 to 14 membered aromatic heterocyclic residue;

wherein R$^3$ and R$^4$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, G$^1$ and G$^2$ are independently from each other C$_{6-14}$-arylene optionally substituted with 1 to 6 substituents R$^a$ or bivalent 5 to 14 membered aromatic heterocyclic residue optionally substituted with 1 to 6 substituents R$^a$, wherein
R$^a$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR$^8$, —S—C$_{1-30}$-alkyl, —NH$_2$, —NHR$^8$, —NR$^8$R$^9$, —NH—COR$^8$, —COOH, —COOR$^8$, —CONH$_2$, —CONHR$^8$, —CONR$^8$R$^9$, —CO—H, —COR$^8$, C$_{1-30}$-alkyl optionally substituted with 1 to 6 substituents R$^f$, C$_{2-30}$-alkenyl optionally substituted with 1 to 6 substituents R$^f$, C$_{2-30}$-alkynyl optionally substituted with 1 to 6 substituents R$^f$, C$_{3-10}$-cycloalkyl optionally substituted with 1 to 6 substituents R$^g$, C$_{5-10}$-cycloalkenyl optionally substituted with 1 to 6 substituents R$^g$ and monovalent 3 to 14 membered aliphatic heterocyclic residue optionally substituted with 1 to 6 substituents R$^g$, wherein
R$^8$ and R$^9$ at each occurrence are independently from each other selected from the group consisting of C$_{1-30}$-alkyl, C$_{2-30}$-alkenyl, C$_{2-30}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, R$^f$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^{10}$, —S—C$_{1-10}$-alkyl, —NH$_2$, —NHR$^{10}$, —NR$^{10}$R$^{11}$, —NH—COR$^{10}$, —COOH, —COOR$^{10}$, —CONH$_2$, —CONHR$^{10}$, —CONR$^{10}$R$^{11}$, —CO—H, —COR$^{10}$, C$_{3-10}$-cycloalkyl, monovalent 3 to 14 membered aliphatic heterocyclic residue, C$_{6-14}$-aryl and monovalent 5 to 14 membered aromatic heterocyclic residue;

R$^g$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^{10}$, —S—C$_{1-10}$-alkyl, —NH$_2$, —NHR$^{10}$, —NR$^{10}$R$^{11}$, —NH—COR$^{10}$, —COOH, —COOR$^{10}$, —CONH$_2$, —CONHR$^{10}$, —CONR$^{10}$R$^{11}$, —CO—H, —COR$^{10}$, C$_{1-10}$-alkyl, C$_{2-10}$-alkenyl, C$_{2-10}$-alkynyl, C$_{6-14}$-aryl and monovalent 5 to 14 membered aromatic heterocyclic residue;

wherein R$^{10}$ and R$^{11}$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, or
G$^1$ and G$^2$ are independently from each other

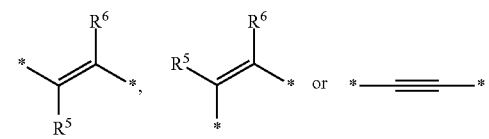

wherein
R$^5$ and R$^6$ are independently from each other H or C$_{1-30}$-alkyl, L is C$_{6-24}$-arylene optionally substituted with 1 to 6 substituents R$^b$ or bivalent 5 to 24 membered aromatic heterocyclic residue optionally substituted with 1 to 6 substituents R$^b$, wherein
R$^b$ at each occurrence are independently from each other selected from the group consisting of =O, =C(CN)$_2$, —O—C$_{2-6}$-alkylene-O—, halogen, —CN, —NO$_2$, —OH, $C_{1-30}$-alkoxy, —O—$CH_2CH_2O$—$C_{1-30}$-alkyl, —O—$COR^{12}$, —S—$C_{1-30}$-alkyl, —$NH_2$, —$NHR^{12}$, —$NR^{12}R^{13}$, —NH—$COR^{12}$, —COOH, —$COOR^{12}$, —$CONH_2$, —$CONHR^{12}$, —$CONR^{12}R^{13}$, —CO—H, —$COR^{12}$, $C_{1-30}$-alkyl optionally substituted with 1 to 6 substituents $R^h$, $C_{2-30}$-alkenyl optionally substituted with 1 to 6 substituents $R^h$, $C_{2-30}$-alkynyl optionally substituted with 1 to 6 substituents $R^h$, $C_{3-10}$-cycloalkyl optionally substituted with 1 to 6 substituents $C_{5-10}$-cycloalkenyl optionally substituted with 1 to 6 substituents $R^i$ and monovalent 3 to 14 membered aliphatic heterocyclic residue optionally substituted with 1 to 6 substituents $R^i$, wherein $R^{12}$ and $R^{13}$ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, $R^h$ at each occurrence are independently from each other selected from the group consisting of =O, =$C(CN)_2$, —O—$C_{2-6}$-alkylene-O—, halogen, —CN, —$NO_2$, —OH, $C_{1-10}$-alkoxy, —O—$CH_2CH_2O$—$C_{1-10}$-alkyl, —O—$COR^{14}$, —S—$C_{1-10}$-alkyl, —$NH_2$, —$NHR^{14}$, —$NR^{14}R^{15}$, —NH—$COR^{14}$, —COOH, —$COOR^{14}$, —$CONH_2$, —$CONHR^{14}$, —$CONR^{14}R^{15}$, —CO—H, —$COR^{14}$, $C_{3-10}$-cycloalkyl, monovalent 3 to 14 membered aliphatic heterocyclic residue, $C_{6-14}$-aryl and monovalent 5 to 14 membered aromatic heterocyclic residue;

$R^i$ at each occurrence are independently from each other selected from the group consisting of =O, =$C(CN)_2$, —O—$C_{2-6}$-alkylene-O—, halogen, —CN, —$NO_2$, —OH, $C_{1-10}$-alkoxy, —O—$CH_2CH_2O$—$C_{1-10}$-alkyl, —O—$COR^{14}$, —S—$C_{1-10}$-alkyl, —$NH_2$, —$NHR^{14}$, —$NR^{14}R^{15}$, —NH—$COR^{14}$, —COOH, —$COOR^{14}$, —$CONH_2$, —$CONHR^{14}$, —$CONR^{14}R^{15}$, —CO—H, $C_{1-10}$-alkyl, $C_{2-10}$-alkenyl, $C_{2-10}$-alkynyl, $C_{6-14}$-aryl and monovalent 5 to 14 membered aromatic heterocyclic residue;

wherein $R^{14}$ and $R^{15}$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, or L is

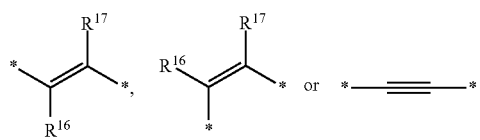

wherein $R^{16}$ and $R^{17}$ are independently from each other H, $C_{1-30}$-alkyl, —CN or halogen, q and s are independently from each other 0, 1, 2, 3, 4 or 5, r is 0, 1 or 2, and n is an integer from 2 to 10,000.

In even more preferred units of formula (1)

$R^1$ and $R^2$ are independently from each other $C_{1-30}$-alkyl optionally substituted with 1 to 6 substituents $R^c$, preferably $C_{1-16}$-alkyl optionally substituted with 1 to 6 substituents $R^c$, more preferably $C_{1-12}$-alkyl optionally substituted with 1 to 6 substituents $R^c$, wherein $R^c$ at each occurrence are independently from each other selected from the group consisting of =O, =$C(CN)_2$, —O—$C_{2-6}$-alkylene-O—, halogen, —CN, —$NO_2$, —OH, $C_{1-10}$-alkoxy, —O—$CH_2CH_2O$—$C_{1-10}$-alkyl, —O—$COR^3$, —S—$C_{1-10}$-alkyl, —$NH_2$, —$NHR^3$, —$NR^3R^4$, —NH—$COR^3$, —COOH, —$COOR^8$, —$CONH_2$, —$CONHR^3$, —$CONR^3R^4$, —CO—H, —$COR^8$, $C_{3-10}$-cycloalkyl, monovalent 3 to 14 membered aliphatic heterocyclic residue, $C_{6-14}$-aryl and monovalent 5 to 14 membered aromatic heterocyclic residue;

wherein $R^3$ and $R^4$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, $G^1$ and $G^2$ are independently from each other bivalent 5 to 14 membered aromatic heterocyclic residue optionally substituted with 1 to 6 substituents $R^a$, wherein $R^a$ at each occurrence are independently from each other selected from the group consisting of =O, =$C(CN)_2$, —O—$C_{2-6}$-alkylene-O—, halogen, —CN, —$NO_2$, —OH, $C_{1-30}$-alkoxy, —O—$CH_2CH_2O$—$C_{1-30}$-alkyl, —O—$COR^8$, —S—$C_{1-30}$-alkyl, —$NH_2$, —$NHR^8$, —$NR^8R^9$, —NH—$COR^8$, —COOH, —$COOR^8$, —$CONH_2$, —$CONHR^8$, —$CONR^8R^9$, —CO—H, —$COR^8$, $C_{1-30}$-alkyl optionally substituted with 1 to 6 substituents $R^f$, $C_{2-30}$-alkenyl optionally substituted with 1 to 6 substituents $R^f$, $C_{2-30}$-alkynyl optionally substituted with 1 to 6 substituents $R^f$, $C_{3-10}$-cycloalkyl optionally substituted with 1 to 6 substituents $R^g$, $C_{5-10}$-cycloalkenyl optionally substituted with 1 to 6 substituents $R^g$ and monovalent 3 to 14 membered aliphatic heterocyclic residue optionally substituted with 1 to 6 substituents $R^g$, wherein $R^8$ and $R^9$ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, $R^f$ at each occurrence are independently from each other selected from the group consisting of =O, =$C(CN)_2$, —O—$C_{2-6}$-alkylene-O—, halogen, —CN, —$NO_2$, —OH, $C_{1-10}$-alkoxy, —O—$CH^2CH^2O$—$C_{1-10}$-alkyl, —O—$COR^{10}$, —S—$C_{1-10}$-alkyl, —$NH_2$, —$NHR^{10}$, —$NR^{10}R^{11}$, —NH—$COR^{10}$, —COOH, —$COOR^{10}$, —$CONH_2$, —$CONHR^{10}$, —$CONR^{10}R^{11}$, —CO—H, —$COR^{10}$, $C_{3-10}$-cycloalkyl, monovalent 3 to 14 membered aliphatic heterocyclic residue, $C_{6-14}$-aryl and monovalent 5 to 14 membered aromatic heterocyclic residue;

$R^g$ at each occurrence are independently from each other selected from the group consisting of =O, =$C(CN)_2$, —O—$C_{2-6}$-alkylene-O—, halogen, —CN, —$NO_2$, —OH, $C_{1-10}$-alkoxy, —O—$CH_2CH_2$O—$C_{1-10}$-alkyl, —O—$COR^{10}$, —S—$C_{1-10}$-alkyl, —$NH_2$, —$NHR^{10}$, —$NR^{10}R^{11}$, —NH—$COR^{10}$, —COOH, —$COOR^{10}$, —$CONH_2$, —$CONHR^{10}$, —$CONR^{10}R^{11}$, —CO—H, —$COR^{10}$, $C_{1-10}$-alkyl, $C_{2-10}$-alkenyl, $C_{2-10}$-alkynyl, $C_{6-14}$-aryl and monovalent 5 to 14 membered aromatic heterocyclic residue;

wherein $R^{10}$ and $R^{11}$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, or $G^1$ and $G^2$ are independently from each other

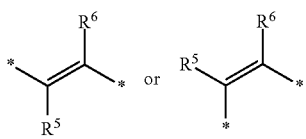

wherein $R^5$ and $R^6$ are independently from each other H or $C_{1-30}$-alkyl, L is bivalent 5 to 24 membered aromatic heterocyclic residue optionally substituted with 1 to 6 substituents $R^b$, wherein $R^b$ at each occurrence are independently from each other selected from the group consisting of =O, =C(CN)$_2$, —O—$C_{2-6}$-alkylene-O—, halogen, —CN, —$NO_2$, —OH, $C_{1-30}$-alkoxy, —O—$CH_2CH_2$O—$C_{1-30}$-alkyl, —O—$COR^{12}$, —S—$C_{1-30}$-alkyl, —$NH_2$, —$NHR^{12}$, —$NR^{12}R^{13}$, —NH—$COR^{12}$, —COOH, —$COOR^{12}$, —$CONH_2$, —$CONHR^{12}$, —$CONR^{12}R^{13}$, —CO—H, —$COR^{12}$, $C_{1-30}$-alkyl optionally substituted with 1 to 6 substituents $R^h$, $C_{2-30}$-alkenyl optionally substituted with 1 to 6 substituents $R^h$, $C_{2-30}$-alkynyl optionally substituted with 1 to 6 substituents $R^h$, $C_{3-10}$-cycloalkyl optionally substituted with 1 to 6 substituents $R^i$, $C_{5-10}$-cycloalkenyl optionally substituted with 1 to 6 substituents $R^i$ and monovalent 3 to 14 membered aliphatic heterocyclic residue optionally substituted with 1 to 6 substituents $R^i$, wherein $R^{12}$ and $R^{13}$ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, $R^h$ at each occurrence are independently from each other selected from the group consisting of =O, =C(CN)$_2$, —O—$C_{2-6}$-alkylene-O—, halogen, —CN, —$NO_2$, —OH, $C_{1-10}$-alkoxy, —O—$CH_2CH_2$O—$C_{1-10}$-alkyl, —O—$COR^{14}$, —S—$C_{1-10}$-alkyl, —$NH_2$, —$NHR^{14}$, —$NR^{14}R^{15}$, —NH—$COR^{14}$, —COOH, —$COOR^{14}$, —$CONH_2$, —$CONHR^{14}$, —$CONR^{14}R^{15}$, —CO—H, —$COR^{14}$, $C_{3-10}$-cycloalkyl, monovalent 3 to 14 membered aliphatic heterocyclic residue, $C_{6-14}$-aryl and monovalent 5 to 14 membered aromatic heterocyclic residue;

$R^i$ at each occurrence are independently from each other selected from the group consisting of =O, =C(CN)$_2$, —O—$C_{2-6}$-alkylene-O—, halogen, —CN, —$NO_2$, —OH, $C_{1-10}$-alkoxy, —O—$CH_2CH_2$O—$C_{1-10}$-alkyl, —O—$COR^{14}$, —S—$C_{1-10}$-alkyl, —$NH_2$, —$NHR^{14}$, —$NR^{14}R^{15}$, —NH—$COR^{14}$, —COOH, —$COOR^{14}$, —$CONH_2$, —$CONHR^{14}$, —$CONR^{14}R^{15}$, —CO—H, —$COR^{14}$, $C_{1-10}$-alkyl, $C_{2-10}$-alkenyl, $C_{2-10}$-alkynyl, $C_{6-14}$-aryl and monovalent 5 to 14 membered aromatic heterocyclic residue;

wherein $R^{14}$ and $R^{15}$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, or L is

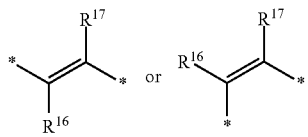

wherein $R^{16}$ and $R^{17}$ are independently from each other H, $C_{1-30}$-alkyl, —CN or halogen, q and s are independently from each other 0, 1, 2, 3, 4 or 5, r is 0, 1 or 2, and n is an integer from 2 to 10,000.

In most preferred units of formula (1)

$R^1$ and $R^2$ are independently from each other $C_{1-16}$-alkyl, more preferably $C_{1-12}$-alkyl, $G^1$ and $G^2$ are independently from each other monocyclic bivalent 5 to 8 membered aromatic heterocyclic residue optionally substituted with 1 to 4 substituents $R^a$, wherein $R^a$ at each occurrence are independently from each other $C_{1-30}$-alkyl optionally substituted with 1 to 4 substituents $R^f$, wherein $R^f$ at each occurrence are independently from each other selected from the group consisting of =O, =C(CN)$_2$, —O—$C_{2-6}$-alkylene-O—, halogen, —CN, —$NO_2$, —OH, $C_{1-10}$-alkoxy, —O—$CH_2CH_2$O—$C_{1-10}$-alkyl, —O—$COR^{10}$, —S—$C_{1-10}$-alkyl, —$NH_2$, —$NHR^{10}$, —$NR^{10}R^{11}$, —NH—$COR^{10}$, —COOH, —$COOR^{10}$, —$CONH_2$, —$CONHR^{10}$, —$CONR^{10}R^{11}$, —CO—H, —$COR^{10}$, $C_{3-10}$-cycloalkyl, monovalent 3 to 14 membered aliphatic heterocyclic residue, $C_{6-14}$-aryl and monovalent 5 to 14 membered aromatic heterocyclic residue;

L is bivalent 5 to 14 membered aromatic heterocyclic residue optionally substituted with 1 to 4 substituents $R^b$, wherein $R^b$ at each occurrence are independently from each other $C_{1-30}$-alkyl optionally substituted with 1 to 4 substituents $R^h$, wherein $R^h$ at each occurrence are independently from each other selected from the group consisting of =O, =C(CN)$_2$, —O—$C_{2-6}$-alkylene-O—, halogen, —CN, —$NO_2$, —OH, $C_{1-10}$-alkoxy, —O—$CH_2CH_2O$—$C_{1-10}$-alkyl, —O—$COR^{14}$, —S—$C_{1-10}$-alkyl, —$NH_2$, —$NHR^{14}$, —$NR^{14}R^{15}$, —NH—$COR^{14}$, —COOH, —$COOR^{14}$, —$CONH_2$, —$CONHR^{14}$, —$CONR^{14}R^{15}$, —CO—H, —$COR^{14}$, $C_{3-10}$-cycloalkyl, monovalent 3 to 14 membered aliphatic heterocyclic residue, $C_{6-14}$-aryl and monovalent 5 to 14 membered aromatic heterocyclic residue;

q and s are independently from each other 1, 2 or 3,
r is 1 or 2,
and
n is an integer from 5 to 10,000.

In even most preferred units of formula (1)
$R^1$ and $R^2$ are independently from each other $C_{1-16}$-alkyl, more preferably $C_{1-12}$-alkyl,
$G^1$ and $G^2$ are independently from each other monocyclic bivalent 5 to 8 membered aromatic heterocyclic residue, wherein $G^1$ and $G^2$ are substituted with 1 to 2 substituents $R^a$,
wherein
$R^a$ at each occurrence are independently from each other $C_{6-20}$-alkyl,
L is bivalent 5 to 14 membered aromatic heterocyclic residue, wherein L is substituted with 1 to 2 substituents $R^b$,
wherein
$R^b$ at each occurrence are independently from each other $C_{6-20}$-alkyl,
q and s are both 1,
r is 1,
and
n is an integer from 5 to 10,000.

Particular preferred units of formula (1) are units of formula

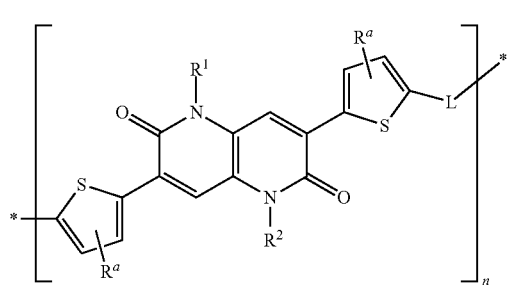

(1a)

wherein $R^1$, $R^2$, $R^a$, L and n are as defined above.
In particular preferred units of formula (1a)
L is

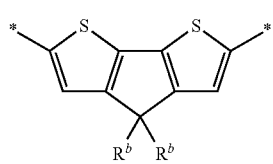

wherein $R^b$ is as defined above.

Preferably, n is an integer from 5 to 5,000, more preferably from 5 to 1,000, even more preferably from 5 to 100, and most preferably from 10 to 100.

A particular preferred example of the units of formulae (1) and (1a) is the unit of formula

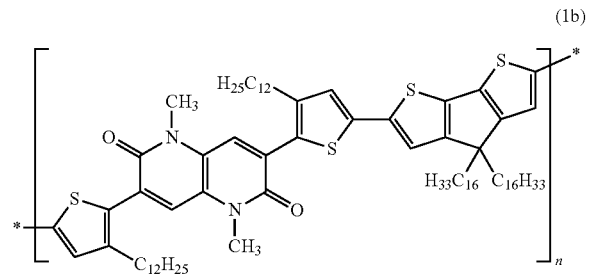

(1b)

wherein n is an integer from 10 to 1000, preferably from 10 to 100.

The semiconducting material of the present invention can be a polymer comprising preferably at least 80% by weight, more preferably at least 90% by weight, of a unit of formula (1), respectively, (1a) based on the weight of the polymer.

Most preferably, the semiconducting material of the present invention is a polymer consisting essentially of a unit of formula (1), respectively, (1a).

The polymer comprising a unit of formula (1) can be prepared by treating a compound of formula

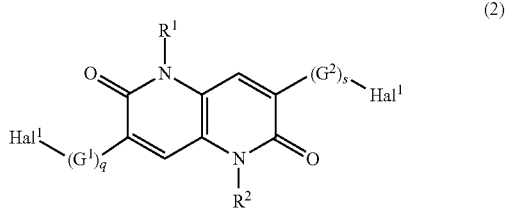

(2)

wherein $R^1$, $R^2$, $G^1$, $G^2$, q and s are as defined above, and Hal1 is halogen, preferably —Br,
with a compound of formula

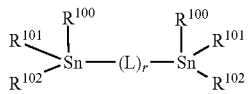

wherein L and q are as defined above, and $R^{100}$, $R^{101}$ and $R^{102}$ are independently from each other $C_{1-10}$-alkyl, preferably methyl.
in the presence of transition metal catalyst 1.

Transition metal catalyst 1 is preferably a palladium catalyst such tris(dibenzylideneacetone)-dipalladium(0), preferably in combination with a phosphine such as tri-o-tolylphosphine. The reaction is preferably performed at elevated temperatures such 80 to 200° C., preferably 90 to 150° C. The reaction can be performed in an inert organic solvent such as chlorobenzene.

The reaction can be stopped by the addition of end cappers such as 2-bromothiophene and 2-thiophene boronic acid. The crude product may be worked up by conventional methods, for example by extracting the crude product with an appropriate solvent, for example with acetone.

The compound of formula (2) can be prepared by treating a compound of formula

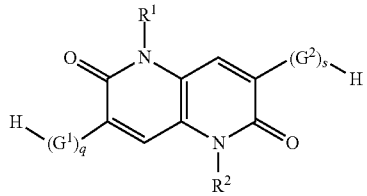

(4)

wherein $R^1$, $R^2$, $G^1$, $G^2$, q and s are as defined above, with a halogenating agent.

The halogenating agent is preferably N-bromosuccinimide. The reaction is preferably performed at ambient temperatures such −5 to 50° C., preferably 0 to 30° C. The reaction can be performed in an organic solvent such chloroform. The crude product may be worked up by conventional methods, for example by column chromatography.

The compound of formula (4) can be prepared by reacting a compound of formula

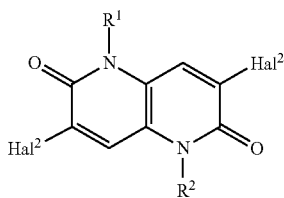

(5)

wherein $R^1$ and $R^2$ are as defined above, with compounds of formulae

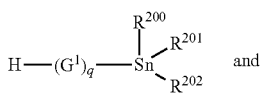

and (6)

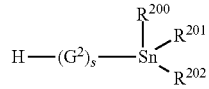

(7)

wherein $G^1$, $G^2$, q and s are as defined above, and $R^{200}$, $R^{201}$ and $R^{202}$ are independently from each other $C_{1-10}$-alkyl, preferably methyl in the presence of a transition metal catalyst 2.

Transition metal catalyst 2 is preferably a palladium catalyst such tetrakis(triphenylphosphine) palladium(0). The reaction is preferably performed at elevated temperatures such 80 to 200° C., preferably 90 to 150° C. The reaction can be performed in an inert organic solvent such as dimethylformamide. The crude product may be worked up by conventional methods, for example by column chromatography.

The compound of formula (5) can be prepared by treating a compound of formula

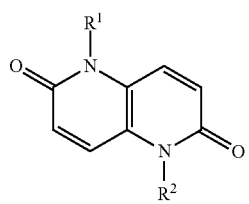

(8)

wherein $R^1$ and $R^2$ are as defined above, with a halogenating agent.

The halogenating agent is preferably Br2. The reaction is preferably performed at ambient temperatures such −5 to 30° C., preferably 0 to 30° C. The reaction can be performed in an organic solvent such dichloromethane. The crude product may be worked up by conventional methods.

The compound of formula (8) can be prepared according to following reaction scheme:

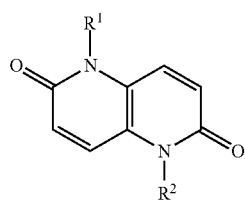

(8)

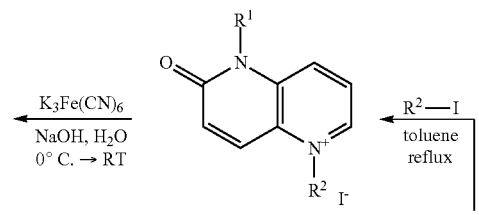

(9)

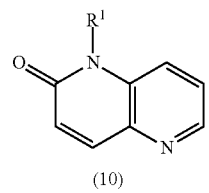

(10)

-continued

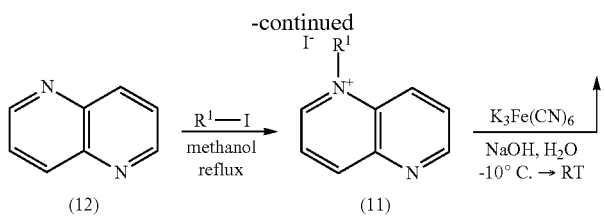

The compounds of formulae (2), (4) and (5) are also part of the invention.

Also part of the present invention is an electronic device comprising the polymer comprising a unit of formula (1) as semiconducting material. Preferably, the electronic device is an organic field effect transistor (OFET), and in particular a thin film transistor (TFT). Preferably, the electronic device is an organic photovoltaic device (OPV).

Usually, an organic field effect transistor comprises a dielectric layer, a semiconducting layer and a substrate. In addition, on organic field effect transistor usually comprises a gate electrode and source/drain electrodes.

An organic field effect transistor can have various designs.

The most common design of a field-effect transistor is the Bottom-Gate Top-Contact (BGTC) design. Here, the gate is on top of the substrate and at the bottom of the dielectric layer, the semiconducting layer is at the top of the dielectric layer and the source/drain electrodes are on top of the semiconducting layer.

Another design of a field-effect transistor is the Top-Gate Bottom-Contact (TGBC) design. Here, the source/drain electrodes are on top of the substrate and at the bottom of the semiconducting layer, the dielectric layer is on top of the semiconducting layer and the gate electrode is on top of the dielectric layer.

The semiconducting layer comprises the semiconducting material of the present invention. The semiconducting layer can have a thickness of 5 to 500 nm, preferably of 10 to 100 nm, more preferably of 20 to 50 nm.

The dielectric layer comprises a dielectric material. The dielectric material can be silicium/silicium dioxide, or, preferably, an organic polymer such as polystyrene (PS), poly(methylmethacrylate) (PMMA), poly(4-vinylphenol) (PVP), poly(vinyl alcohol) (PVA), anzocyclobutene (BCB), or polyimide (PI). The dielectric layer can have a thickness of 10 to 2000 nm, preferably of 50 to 1000 nm, more preferably of 100 to 800 nm.

The source/drain contacts and the gate contact can be made from any suitable material, for example Au.

The substrate can be any suitable substrate such as glass, or a plastic substrate. Preferably the substrate is a plastic substrate such as polyethersulfone, polycarbonate, polysulfone, polyethylene terephthalate (PET) and polyethylene naphthalate (PEN). More preferably, the plastic substrate is a plastic foil.

The organic field effect transistor can be prepared by methods known in the art.

For example, a top-gate bottom-contact (TGBC) thin film transistors (TFTs) can be prepared as follows: first: the source/drain contacts are placed on the substrate, for example by thermal evaporation of the source/drain material; second: the substrate is coated with the semiconducting layer, for example by spin-coating a solution of the semiconducting material in a suitable solvent and drying the semiconducting layer at elevated temperatures, for example at 80 to 100° C.; third: the semiconducting layer is coated with a solution of the dielectric material in a suitable solvent, for example by spin-coating a solution of the dielectric material and drying the dielectric layer at elevated temperatures, for example at 80 to 100° C.; fourth: the gate contact is placed on top of the dielectric layer, for example by thermal evaporation of the gate material.

Also part of the present invention is the use of the polymer comprising the unit of formula (1) as semiconducting material.

Electronic devices comprising the semiconducting materials of the present invention show high charge carrier mobility as well as high stability, in particular towards oxidation by air, under ambient environmental conditions.

In addition, the semiconducting materials of the present invention are compatible with liquid processing techniques such as spin coating and thus allow the production of low cost, light weight and flexible electronic devices.

EXAMPLES

Example 1

Preparation of Polymer P1 Essentially Consisting of Units of Formula (1b)

The polymer P1 essentially consisting of units of formula (1b) is prepared according to the following reaction scheme:

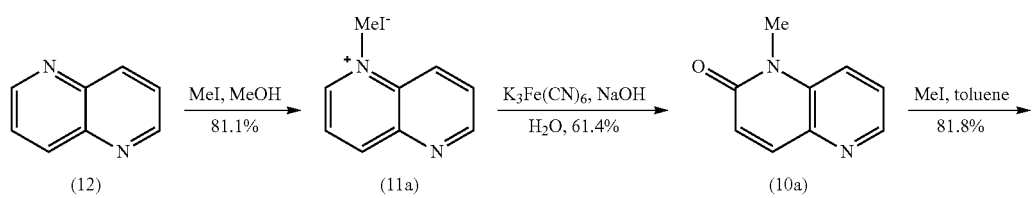

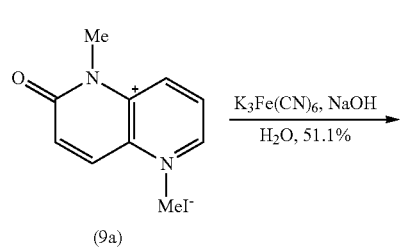
(9a)

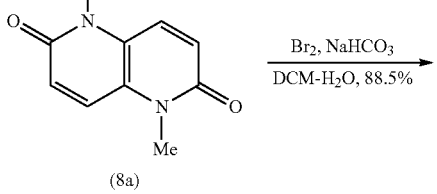
(8a)

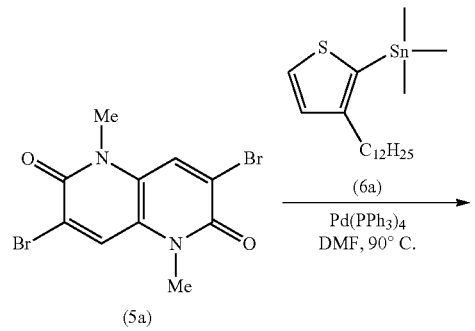
(5a)

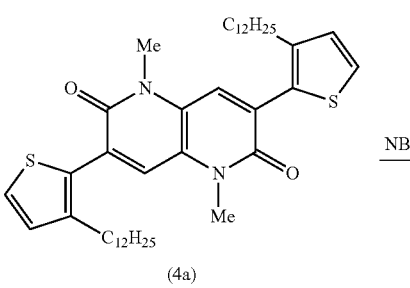
(4a)

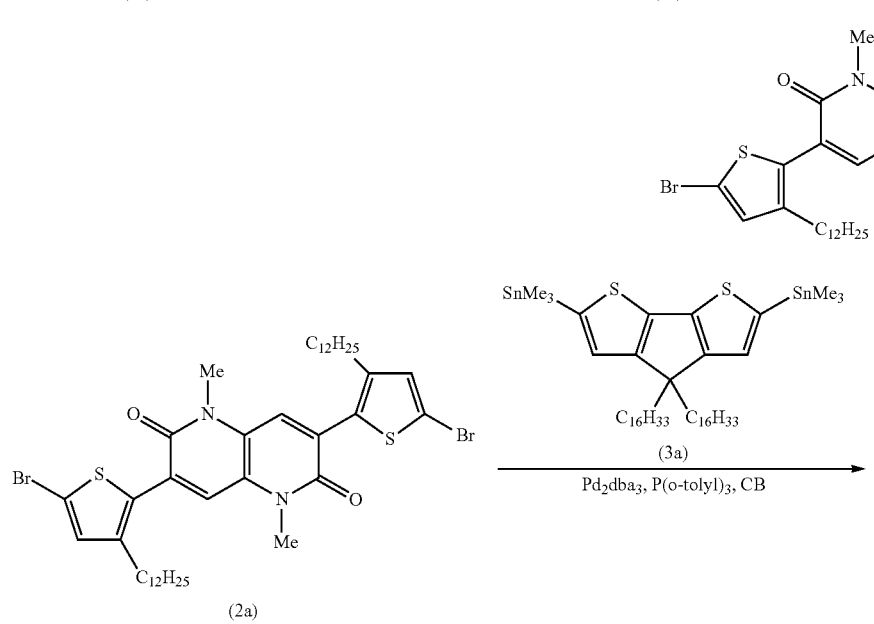

Preparation of the Compound of Formula (11a)

Methyl iodide (10.9 g, 76.8 mmol) is added to a solution of 1,5-naphthyridine (12) (5 g, 38.4 mmol) in MeOH (30 mL) and the reaction mixture is heated at 40° C. over 3 days under $N_2$. The precipitate is filtered and dried under high vacuum to afford compound 11a as yellowish green solid (8.51 g, 81.1%). $^1$H NMR (400 MHz, CDCl$_3$, r.t.) δ 9.49 (d, 1H), 9.38 (dd, 1H), 9.26 (d, 1H), 8.98 (dd, 1H), 4.75 (s, 3H).

Preparation of the Compound of Formula (10a)

NaOH solution (5.6 g, 140.2 mmol, in 30 mL H$_2$O) and K$_3$Fe(CN)$_6$ solution (21.6 g, 65.5 mmol, in 30 mL H$_2$O) are added concurrently over 30 min to a solution of napthyridine methiodide (11a) (8.5 g, 31.2 mmol) in H$_2$O (80 mL) at −10° C. The reaction mixture is allowed to warm to RT overnight. Excess NaCl is added and the reaction mixture is then extracted with CHCl$_3$ (150 mL×3). The combined organic phases are dried over Na$_2$SO$_4$, filtered and concentrated in vacuo. The crude product is purified by flash column using MeOH+1% TEA on silica gel to afford compound 10a as violet solid (3.07 g, 61.4%). $^1$H NMR (400 MHz, CD$_3$OD, r.t.) δ 12.49 (d, 1H), 12.00 (d, 1H), 11.91 (d, 1H), 11.59 (dd, 1H), 10.88 (d, 1H), 8.79 (s, 3H).

Preparation of the Compound of Formula (9a)

MeI (3.58 mL, 57.5 mmol) is added to a solution of compound 10a (3.07 g, 19.2 mmol) in toluene (50 mL) and the reaction mixture is allowed to stir at 115° C. for 2 days. The reaction mixture is filtered and dried in vacuo to afford compound 9a as green solid (4.75 g, 81.8%). $^1$H NMR (400 MHz, CD$_3$OD, r.t.) δ 8.95 (d, 1H), 8.79 (d, 1H), 8.50 (dd, 1H), 8.19 (dd, 1H), 7.34 (d, 1H), 4.63 (s, 3H), 3.87 (s, 3H).

Preparation of the Compound of Formula (8a)

NaOH solution (4.39 g, 109.7 mmol, in 15 mL H$_2$O) and K$_3$Fe(CN)$_6$ solution (15.51 g, 47.1 mmol, in 50 mL of water) are added concurrently over 30 min to a solution of methyl-napthyridine methiodide 9a (4.75 g, 15.7 mmol) in H$_2$O (25 mL) at 0° C. The reaction mixture is allowed to stir at 0° C. for 30 min and is then allowed to warm to RT overnight. Excess NaCl is added followed by extraction with CHCl$_3$ (100 mL×3). The combined organic phases are dried over Na$_2$SO$_4$ and concentrated in vacuo. Recrystallization in MeOH/Acetone mixture afforded compound 8a as orange brown crystals (1.52 g, 51.1%). $^1$H NMR (400 MHz, CD$_3$OD, r.t.) δ 8.04 (d, 2H), 6.92 (d, 2H), 4.87 (s, 3H), 3.80 (s, 3H).

Preparation of the Compound of Formula (5a)

1,5-dimethylnapthyridine-dione 8a (1.35 g, 7.08 mmol), NaHCO$_3$ (2.38 g, 28.3 mmol) and bromine (2.83 g, 17.1 mmol) are dissolved in dichloromethane/H$_2$O mixture (1:1, 200 mL) at 0° C. and allowed to warm to RT overnight. The reaction mixture is filtered and washed with MeOH. Saturated sodium thiosulfate (aq) is added to the filtrate and the aqueous phase is extracted with dichloromethane (200 mL×3). The combined organic phases are dried over Na$_2$SO$_4$ and concentrated in vacuo. The combined solids are dispersed in methanol, subjected to 3 cycles of sonication, followed by centrifugation and decantation to yield yellow compound 5a (2.18 g, 88.5%). $^1$H NMR (400 MHz, DMSO, r.t.) δ 8.36 (s, 2H), 3.72 (s, 6H).

Preparation of the Compound of Formula (4a)

Pd(PPh$_3$)$_4$ (0.11 g, 0.10 mmol) is added to a solution of compound 5a (0.68 g, 1.97 mmol) and compounds 6a (2.45 g, 5.90 mmol) in degassed dimethylformamide (23 mL). The reaction mixture is heated to 130° C. and stirred overnight. The reaction mixture is allowed to cool to RT, washed with H$_2$O (25 mL), extracted with CH$_2$Cl$_2$ (25 mL×3), dried over Na$_2$SO$_4$ and concentrated. The residue is purified by flash column (0→100% ethyl acetate/hexane) to afford compound 4a as red solid (0.42 g, 31%). $^1$H NMR (400 MHz, CDCl$_3$, r.t.) δ 7.71 (s, 2H), 7.42 (d, 2H), 7.04 (d, 2H), 3.82 (s, 6H), 2.73 (t, 4H), 1.67-1.48 (m, 35H), 0.87-0.85 (m, 11H).

Preparation of the Compound of Formula (2a)

N-bromosuccinimide (0.17 g, 0.97 mmol) is added to a solution of compound 4a (0.32 g, 0.46 mmol) in CHCl$_3$ (32 mL) at 0° C. The temperature of the reaction mixture is allowed to slowly rise to RT and the reaction mixture is stirred overnight. The reaction mixture is quenched with H$_2$O (50 mL), extracted with CHCl$_3$ (50 mL×3), washed with brine, dried over Na$_2$SO$_4$ and concentrated. Crude compound 2a is purified by flash column (0→50% ethyl acetate/hexane) to afford compound 2a as red solid (0.46 g, 88%). $^1$H NMR (400 MHz, CDCl$_3$, r.t.) δ 7.68 (s, 2H), 6.98 (s, 2H), 3.80 (s, 6H), 2.69 (t, 4H), 1.68-1.56 (m, 35H), 0.88-0.84 (m, 11H).

Preparation of Polymer P1 Essentially Consisting of Units of Formula (1b)

Compound 2a (100 mg, 0.12 mmol), compound 3a (112 mg, 0.12 mmol), Pd$_2$dba$_3$ (5.4 mg, 0.006 mmol) and P(o-tolyl)$_3$ (3.6 mg, 0.01 mmol) are added to a Schlenk tube and degassed 3 times with nitrogen. Chlorobenzene (3 mL) is then added and the reaction mixture is heated under N2 at 130° C. After 2 days, 1 drop of 2-bromothiophene is added and the reaction mixture is allowed to stir for 1 h. 1 drop of 2-(tributylstannyl)thiophene is added and the reaction mixture is allowed to stir at 130° C. overnight. The reaction mixture is poured slowly into 500 mL of MeOH. The mixture is stirred for 2 h. The precipitate obtained is filtered and subjected to Soxhlet extraction with acetone overnight. The filtrate is dried under vacuo, dissolved in minimum amount of hot chlorobenzene and precipitated again by pouring it into beaker with methanol. The mixture is stirred for 1 h, filtered and the filtrate is dried under vacuum overnight to afforded polymer P1 as red solid (36 mg, 23%). $^1$H NMR (400 MHz, DCE, r.t.) δ 7.72 (brs, 2H), 7.22-7.12 (m, 4H), 3.83 (brs, 6H), 2.80 (brs, 4H), 1.79-0.85 (m, 112H). Mn: 1.24×10$^4$, PDI: 2.53.

Example 2

Preparation of Top-Gate Bottom-Contact Transistors (TGBC) Containing the Polymer P1, Essentially Consisting of the Units of Formula 1b, as Semiconducting Material A top-gate bottom-contact (TGBC) thin film transistor (TFT) is fabricated on glass (PGO glass used as received). Au source-drain contacts (30 nm-thick) are thermally-evaporated. The substrate is then coated with the semiconductor layer (thickness: 40 to 50 nm) by spin-coating (1000 rpm) a solution of polymer P1 (prepared as described in example 1) in dichloromethane (concentration ~10 mg/mL), and drying the film at 90° C. for 30 seconds. A 4 weight % polystyrene solution in isopropyl acetate is spin-coated (3600 rpm) and the dielectric film formed is dried at 90° C. for 30 seconds to yield a dielectric layer (thickness: 500 to 600 nm). The device structure is completed by vapor deposition of patterned Au gate contacts (~30 nm thick) through a shadow mask. Channel lengths and widths are 50 μm and 0.5 mm, respectively, to afford W/L=10.

The top-gate, bottom-contact (TGBC) thin film transistors of example 2 show the following mobility: 4×10$^{-3}$ cm$^2$V$^{-1}$s$^{-1}$.

The invention claimed is:

1. A polymer comprising a unit of formula (1):

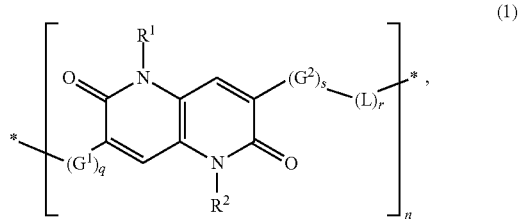

wherein:

R$^1$ and R$^2$ are independently from each other H, C$_{1-30}$-alkyl optionally substituted with 1 to 6 substituents C$_{2-30}$-alkenyl optionally substituted with 1 to 6 substituents R$^c$, C$_{2-30}$-alkynyl optionally substituted with 1 to 6 substituents R$^c$, C$_{3-10}$-cycloalkyl optionally substituted with 1 to 6 substituents $R^d$, $C_{5-10}$-cycloalkenyl optionally substituted with 1 to 6 substituents $R^d$, monovalent 3 to 14 membered aliphatic heterocyclic residue optionally substituted with 1 to 6 substituents $R^d$, $C_{6-14}$-aryl optionally substituted with 1 to 6 substituents $R^e$ or monovalent 5 to 14 membered aromatic heterocyclic residue optionally substituted with 1 to 6 substituents $R^e$;

$R^c$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{3-10}$-cycloalkyl, monovalent 3 to 14 membered aliphatic heterocyclic residue, $C_{6-14}$-aryl and monovalent 5 to 14 membered aromatic heterocyclic residue;

$R^d$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{1-40}$-alkyl, $C_{2-10}$-alkenyl, $C_{2-10}$-alkynyl, $C_{6-14}$-aryl and monovalent 5 to 14 membered aromatic heterocyclic residue;

$R^e$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{1-10}$-alkyl, $C_{2-10}$-alkenyl, $C_{2-10}$-alkynyl, $C_{3-10}$-cycloalkyl, $C_{5-10}$-cycloalkenyl and monovalent 3 to 14 membered aliphatic heterocyclic residue;

$R^3$ and $R^4$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue;

$G^1$ and $G^2$ are independently from each other $C_{6-14}$-arylene optionally substituted with 1 to 6 substituents $R^a$ or bivalent 5 to 14 membered aromatic heterocyclic residue optionally substituted with 1 to 6 substituents $R^a$;

$R^a$ at each occurrence are independently from each other selected from the group consisting of =O, =C(CN)$_2$, —O—$C_{2-6}$-alkylene-O—, halogen, —CN, —NO$_2$, —OH, $C_{1-30}$-alkoxy, —O—CH$_2$CH$_2$O—$C_{1-30}$-alkyl, —O—COR$^8$, —S—$C_{1-30}$-alkyl, —NH$_2$, —NHR$^8$, —NR$^8$R$^9$, —NH—COR$^8$, —COOH, —COOR$^8$, —CONH$_2$, —CONHR$^8$, —CONR$^8$R$^9$, —CO—H, —COR$^8$, $C_{1-30}$-alkyl optionally substituted with 1 to 6 substituents $R^f$, $C_{2-30}$-alkenyl optionally substituted with 1 to 6 substituents $R^f$, $C_{2-30}$-alkynyl optionally substituted with 1 to 6 substituents $R^f$, $C_{3-10}$-cycloalkyl optionally substituted with 1 to 6 substituents $R^g$, $C_{5-10}$-cycloalkenyl optionally substituted with 1 to 6 substituents $R^g$ and monovalent 3 to 14 membered aliphatic heterocyclic residue optionally substituted with 1 to 6 substituents $R^g$;

$R^8$ and $R^9$ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue;

$R^f$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^{10}$, —S—$C_{1-10}$-alkyl, —NH$_2$, —NHR$^{10}$, —NR$^{10}$R$^{11}$, —NH—COR$^{10}$, —COOH, —COOR$^{10}$, —CONH$_2$, —CONHR$^{10}$, —CONR$^{10}$R$^{11}$, —CO—H, —COR$^{10}$, $C_{3-10}$-cycloalkyl, monovalent 3 to 14 membered aliphatic heterocyclic residue, $C_{6-14}$-aryl and monovalent 5 to 14 membered aromatic heterocyclic residue;

$R^g$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^{10}$, —S—$C_{1-10}$-alkyl, —NH$_2$, —NHR$^{10}$, —NR$^{10}$R$^{11}$, —NH—COR$^{10}$, —COOH, —COOR$^{10}$, —CONH$_2$, —CONHR$^{10}$, —CONR$^{10}$R$^{11}$, —CO—H, —COR$^{10}$, $C_{1-10}$-alkyl, $C_{2-10}$-alkenyl, $C_{2-10}$-alkynyl, $C_{6-14}$-aryl and monovalent 5 to 14 membered aromatic heterocyclic residue; and $R^{10}$ and $R^{11}$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, or wherein:

$G^1$ and $G^2$ are independently from each other:

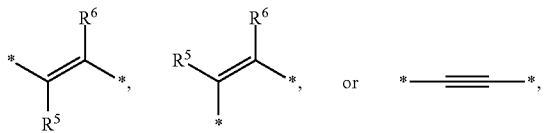

$R^5$ and $R^6$ are independently from each other H or $C_{1-30}$-alkyl;

L is $C_{6-24}$-arylene optionally substituted with 1 to 6 substituents $R^b$ or bivalent 5 to 24 membered aromatic heterocyclic residue optionally substituted with 1 to 6 substituents $R^b$;

$R^b$ at each occurrence are independently from each other selected from the group consisting of =O, =C(CN)$_2$, —O—$C_{2-6}$-alkylene-O—, halogen, —CN, —NO$_2$, —OH, $C_{1-30}$-alkoxy, —O—CH$_2$CH$_2$O—$C_{1-30}$-alkyl, —O—COR$^{12}$, —S—$C_{1-30}$-alkyl, —NH$_2$, —NHR$^{12}$, —NR$^{12}$R$^{13}$, —NH—COR$^{12}$, —COOH, —COOR$^{12}$, —CONH$_2$, —CONHR$^{12}$, —CONR$^{12}$R$^{13}$, —CO—H, —COR$^{12}$, $C_{1-30}$-alkyl optionally substituted with 1 to 6 substituents $R^h$, $C_{2-30}$-alkenyl optionally substituted with 1 to 6 substituents $R^h$, $C_{2-30}$-alkynyl optionally substituted with 1 to 6 substituents $R^h$, $C_{3-10}$-cycloalkyl optionally substituted with 1 to 6 substituents $R^i$, $C_{5-10}$-cycloalkenyl optionally substituted with 1 to 6 substituents $R^i$ and monovalent 3 to 14 membered aliphatic heterocyclic residue optionally substituted with 1 to 6 substituents $R^i$;

$R^{12}$ and $R^{13}$ at each occurrence are independently from each other selected from the group consisting of $C_{1-30}$- alkyl, $C_{2-30}$-alkenyl, $C_{2-30}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue;

$R^h$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^{14}$, —S—$C_{1-10}$-alkyl, —NH$_2$, —NHR$^{14}$, —NR$^{14}$R$^{15}$, —NH—COR$^{14}$, —COOH, —COOR$^{14}$, —CONH$_2$, —CONHR$^{14}$, —CONR$^{14}$R$^{15}$, —CO—H, —COR$^{14}$, $C_{3-10}$-cycloalkyl, monovalent 3 to 14 membered aliphatic heterocyclic residue, $C_{6-14}$-aryl and monovalent 5 to 14 membered aromatic heterocyclic residue;

$R^i$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^{14}$, —S—$C_{1-10}$-alkyl, —NH$_2$, —NHR$^{14}$, —NR$^{14}$R$^{15}$, —NH—COR$^{14}$, —COOH, —COOR$^{14}$, —CONH$_2$, —CONHR$^{14}$, —CONR$^{14}$R$^{15}$, —CO—H, —COR$^{14}$, $C_{1-10}$-alkyl, $C_{2-10}$-alkenyl, $C_{2-10}$-alkynyl, $C_{6-14}$-aryl and monovalent 5 to 14 membered aromatic heterocyclic residue; and $R^{14}$ and $R^{15}$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, or
wherein:
L is:

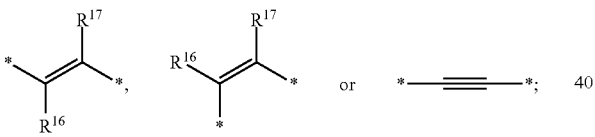

$R^{16}$ and $R^{17}$ are independently from each other H, $C_{1-30}$-alkyl, —CN or halogen;
q and s are independently from each other 0, 1, 2, 3, 4 or 5;
r is 0, 1 or 2; and
n is an integer from 2 to 10,000.

2. The polymer of claim 1, wherein:
$R^1$ and $R^2$ are independently from each other H, $C_{1-30}$-alkyl optionally substituted with 1 to 6 substituents $R^c$, $C_{2-30}$-alkenyl optionally substituted with 1 to 6 substituents $R^c$, $C_{2-30}$-alkynyl optionally substituted with 1 to 6 substituents $R^c$, $C_{3-10}$-cycloalkyl optionally substituted with 1 to 6 substituents $R^d$, $C_{5-10}$-cycloalkenyl or $C_{6-14}$-aryl optionally substituted with 1 to 6 substituents $R^e$;

$R^c$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{3-10}$-cycloalkyl, monovalent 3 to 14 membered aliphatic heterocyclic residue, $C_{6-14}$-aryl and monovalent 5 to 14 membered aromatic heterocyclic residue;

$R^d$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{1-10}$-alkyl, $C_{2-40}$-alkenyl, $C_{2-10}$-alkynyl, $C_{6-14}$-aryl and monovalent 5 to 14 membered aromatic heterocyclic residue;

$R^e$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{1-10}$-alkyl, $C_{2-10}$-alkenyl, $C_{2-10}$-alkynyl, $C_{3-10}$-cycloalkyl, $C_{5-10}$-cycloalkenyl and monovalent 3 to 14 membered aliphatic heterocyclic residue; and $R^3$ and $R^4$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue.

3. The polymer of claim 1, wherein:
$R^1$ and $R^2$ are independently from each other $C_{1-30}$-alkyl optionally substituted with 1 to 6 substituents $R^c$;

$R^c$ at each occurrence are independently from each other selected from the group consisting of =O, =C(CN)$_2$, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^3$, —S—$C_{1-10}$-alkyl, —NH$_2$, —NHR$^3$, —NR$^3$R$^4$, —NH—COR$^3$, —COOH, —COOR$^3$, —CONH$_2$, —CONHR$^3$, —CONR$^3$R$^4$, —CO—H, —COR$^3$, $C_{3-10}$-cycloalkyl, monovalent 3 to 14 membered aliphatic heterocyclic residue, $C_{6-14}$-aryl and monovalent 5 to 14 membered aromatic heterocyclic residue; and $R^3$ and $R^4$ at each occurrence are independently from each other selected from the group consisting of $C_{1-10}$-alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue.

4. The polymer of claim 1, wherein $R^1$ and $R^2$ are independently from each other $C_{1-16}$-alkyl.

5. The polymer of any one of claims 1 to 4, wherein:
$G^1$ and $G^2$ are independently from each other bivalent 5 to 14 membered aromatic heterocyclic residue optionally substituted with 1 to 6 substituents $R^a$;

$R^a$ at each occurrence are independently from each other selected from the group consisting of =O, =C(CN)$_2$, —O—$C_{2-6}$-alkylene-O—, halogen, —CN, —NO$_2$, —OH, $C_{1-30}$-alkoxy, —O—CH$_2$CH$_2$O—$C_{1-30}$-alkyl, —O—COR$^8$, —S—$C_{1-30}$-alkyl, —NH$_2$, —NHR$^8$, —NR$^8$R$^9$, —NH—COR$^8$, —COOH, —COOR$^3$, —CONH$_2$, —CONHR$^8$, —CONR$^8$R$^9$, —CO—H, —COR$^8$, $C_{1-30}$-alkyl optionally substituted with 1 to 6 substituents $R^f$, $C_{2-30}$-alkenyl optionally substituted with 1 to 6 substituents $R^f$, $C_{2-30}$-alkynyl optionally substituted with 1 to 6 substituents $R^f$, $C_{3-10}$-cycloalkyl optionally substituted with 1 to 6 substituents $R^g$, $C_{5-10}$-cycloalkenyl optionally substituted with 1 to 6 substituents $R^g$ and monovalent 3 to 14 membered aliphatic heterocyclic residue optionally substituted with 1 to 6 substituents $R^g$;

$R^8$ and $R^9$ at each occurrence are independently from each other selected from the group consisting of $C_{1-30}$-alkyl, $C_{2-30}$-alkenyl, $C_{2-30}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue;

$R^f$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^{10}$, —S—C$_{1-10}$-alkyl, —NH$_2$, —NHR$^{10}$, —NR$^{10}$R$^{11}$, —NH—COR$^{10}$, —COOH, —COOR$^{10}$, —CONH$_2$, —CONHR$^{10}$, —CONR$^{10}$R$^{11}$, —CO—H, —COR$^{10}$, C$_{3-10}$-cycloalkyl, monovalent 3 to 14 membered aliphatic heterocyclic residue, C$_{6-14}$-aryl and monovalent 5 to 14 membered aromatic heterocyclic residue;

$R^g$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^{10}$, —S—C$_{1-10}$-alkyl, —NH$_2$, —NHR$^{10}$, —NR$^{10}$R$^{11}$, —NH—COR$^{10}$, —COOH, —COOR$^{10}$, —CONH$_2$, —CONHR$^{10}$, —CONR$^{10}$R$^{11}$, —CO—H, —COR$^{10}$, C$_{1-10}$-alkyl, C$_{2-10}$-alkenyl, C$_{2-10}$-alkynyl, C$_{6-14}$-aryl and monovalent 5 to 14 membered aromatic heterocyclic residue; and $R^{10}$ and $R^{11}$ at each occurrence are independently from each other selected from the group consisting of C$_{1-10}$-alkyl, C$_{2-10}$-alkenyl, C$_{2-10}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue, or wherein:

$G^1$ and $G^2$ are independently from each other:

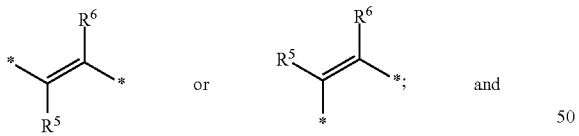

$R^5$ and $R^6$ are independently from each other H or C$_{1-30}$-alkyl.

6. The polymer of any one of claims 1 to 4, wherein:

$G^1$ and $G^2$ are independently from each other monocyclic bivalent 5 to 8 membered aromatic heterocyclic residue optionally substituted with 1 to 4 substituents $R^a$;

$R^a$ at each occurrence are independently from each other C$_{1-30}$-alkyl optionally substituted with 1 to 4 substituents $R^f$; and $R^f$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^{10}$, —S—C$_{1-10}$-alkyl, —NH$_2$, —NHR$^{10}$, —NR$^{10}$R$^{11}$, —NH—COR$^{10}$, —COOH, —COOR$^{10}$, —CONH$_2$, —CONHR$^{10}$, —CONR$^{10}$R$^{11}$, —CO—H, —COR$^{10}$, C$_{3-10}$-cycloalkyl, monovalent 3 to 14 membered aliphatic heterocyclic residue, C$_{6-14}$-aryl and monovalent 5 to 14 membered aromatic heterocyclic residue.

7. The polymer of any one of claims 1 to 4, wherein:

$G^1$ and $G^2$ are independently from each other monocyclic bivalent 5 to 8 membered aromatic heterocyclic residue, such that $G^1$ and $G^2$ are substituted with 1 to 2 substituents $R^a$; and $R^a$ at each occurrence are independently from each other C$_{6-20}$-alkyl.

8. The polymer of any one of claims 1 to 4, wherein:

L is bivalent 5 to 24 membered aromatic heterocyclic residue optionally substituted with 1 to 6 substituents $R^b$;

$R^b$ at each occurrence are independently from each other selected from the group consisting of =O, =C(CN)$_2$, —O—C$_{2-6}$-alkylene-O—, halogen, —CN, —NO$_2$, —OH, C$_{1-30}$-alkoxy, —O—CH$_2$CH$_2$O—C$_{1-30}$-alkyl, —O—COR$^{12}$, —S—C$_{1-30}$-alkyl, —NH$_2$, —NHR$^{12}$, —NR$^{12}$R$^{13}$, —NH—COR$^{12}$, —COOH, —COOR$^{12}$, —CONH$_2$, —CONHR$^{12}$, —CONR$^{12}$R$^{13}$, —CO—H, —COR$^{12}$, C$_{1-30}$-alkyl optionally substituted with 1 to 6 substituents $R^h$, C$_{2-30}$-alkenyl optionally substituted with 1 to 6 substituents $R^h$, C$_{2-30}$-alkynyl optionally substituted with 1 to 6 substituents $R^h$, C$_{3-10}$-cycloalkyl optionally substituted with 1 to 6 substituents $R^i$, C$_{5-10}$-cycloalkenyl optionally substituted with 1 to 6 substituents $R^i$ and monovalent 3 to 14 membered aliphatic heterocyclic residue optionally substituted with 1 to 6 substituents $R^i$;

$R^{12}$ and $R^{13}$ at each occurrence are independently from each other selected from the group consisting of C$_{1-30}$-alkyl, C$_{2-30}$-alkenyl, C$_{2-30}$-alkynyl, C$_{3-10}$-cycloalkyl, C$_{5-10}$-cycloalkenyl, monovalent 3 to 14 membered aliphatic heterocyclic residue, C$_{6-14}$-aryl and monovalent 5 to 14 membered aromatic heterocyclic residue;

$R^h$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^{14}$, —S—C$_{1-10}$-alkyl, —NH$_2$, —NHR$^{14}$, —NR$^{14}$R$^{15}$, —NH—COR$^{14}$, —COOH, —COOR$^{14}$, —CONH$_2$, —CONHR$^{14}$, —CONR$^{14}$R$^{15}$, —CO—H, —COR$^{14}$, C$_{3-10}$-cycloalkyl, monovalent 3 to 14 membered aliphatic heterocyclic residue, C$_{6-14}$-aryl and monovalent 5 to 14 membered aromatic heterocyclic residue;

$R^i$ at each occurrence are independently from each other selected from the group consisting of =O, =C(CN)$_2$, —O—C$_{2-6}$-alkylene-O—, halogen, —CN, —NO$_2$, —OH, C$_{1-10}$-alkoxy, —O—CH$_2$CH$_2$O—C$_{1-10}$-alkyl, —O—COR$^{14}$, —S—C$_{1-10}$-alkyl, —NH$_2$, —NHR$^{14}$, —NR$^{14}$R$^{15}$, —NH—COR$^{14}$, —COOH, —COOR$^{14}$, —CONH$_2$, —CONHR$^{14}$, —CONR$^{14}$R$^{15}$, —CO—H, —COR$^{14}$, C$_{1-10}$-alkyl, C$_{2-10}$-alkenyl, C$_{2-10}$-alkynyl, C$_{6-14}$-aryl and monovalent 5 to 14 membered aromatic heterocyclic residue; and wherein $R^{14}$ and $R^{15}$ at each occurrence are independently from each other selected from the group consisting of C$_{1-10}$- alkyl, $C_{2-10}$-alkenyl, $C_{2-10}$-alkynyl, $C_{3-10}$-cycloalkyl, $C_{5-10}$-cycloalkenyl, monovalent 3 to 14 membered aliphatic heterocyclic residue, $C_{6-14}$-aryl and monovalent 5 to 14 membered aromatic heterocyclic residue, or wherein:

L is:

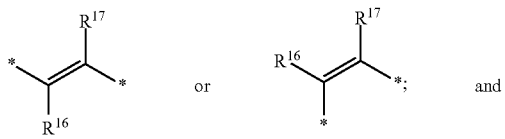

$R^{16}$ and $R^{17}$ are independently from each other H, $C_{1-30}$-alkyl, —CN or halogen.

9. The polymer of any one of claims 1 to 4, wherein:

L is bivalent 5 to 14 membered aromatic heterocyclic residue optionally substituted with 1 to 4 substituents $R^b$;

$R^b$ at each occurrence are independently from each other $C_{1-30}$-alkyl optionally substituted with 1 to 4 substituents $R^h$; and $R^h$ at each occurrence are independently from each other selected from the group consisting of =O, —O—$C_{2-6}$-alkylene-O—, halogen, —CN, —NO$_2$, —OH, $C_{1-10}$-alkoxy, —O—CH$_2$CH$_2$O—$C_{1-10}$-alkyl, —O—COR$^{14}$, —S—$C_{1-10}$-alkyl, —NH$_2$, —NHR$^{14}$, —NR$^{14}$R$^{15}$, —NH—COR$^{14}$, —COOH, —COOR$^{14}$, —CONH$_2$, —CONHR$^{14}$, —CONR$^{14}$R$^{15}$, —CO—H, —COR$^{14}$, $C_{3-10}$-cycloalkyl, monovalent 3 to 14 membered aliphatic heterocyclic residue, $C_{6-14}$-aryl and monovalent 5 to 14 membered aromatic heterocyclic residue.

10. The polymer of any one of claims 1 to 4, wherein:

L is bivalent 5 to 14 membered aromatic heterocyclic residue, such that L is substituted with 1 to 2 substituents $R^b$; and $R^b$ at each occurrence are independently from each other $C_{6-20}$-alkyl.

11. The polymer of any one of claims 1 to 4, wherein:

q and s are independently from each other 1, 2 or 3;

r is 1 or 2; and n is an integer from 5 to 10,000.

12. The polymer of claim 11, wherein:

q and s are both 1;

r is 1; and n is an integer from 5 to 10,000.

13. The polymer of claim 1, wherein the unit of formula (1) is a unit of formula:

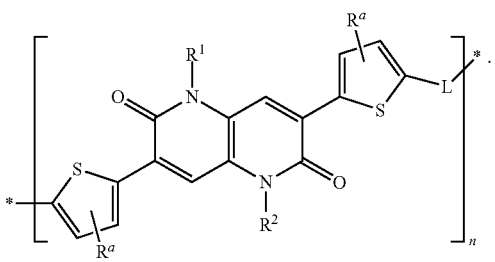

14. The polymer of claim 13, wherein L is:

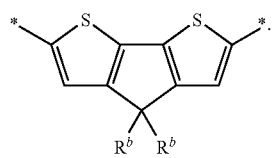

15. The polymer of any one of claims 1 to 4 or 13 to 14, wherein n is an integer from 5 to 5,000.

16. An electronic device, comprising the polymer of any one of claims 1 to 4 or 13 to 14.

17. The electronic device of claim 16, which is an organic field effect transistor (OFET).

18. The electronic device of claim 16, which is an organic photovoltaic device (OPV).

19. A semiconducting material, comprising the polymer of any one of claims 1 to 4 or 13 to 14.

* * * * *